US008395894B2

(12) United States Patent
Richardson et al.

(10) Patent No.: US 8,395,894 B2
(45) Date of Patent: Mar. 12, 2013

(54) PROTECTIVE ENCLOSURE FOR ELECTRONIC DEVICE

(75) Inventors: Curtis R. Richardson, Fort Collins, CO (US); Alan Morine, Ft Collins, CO (US); Brian Thomas, Ft Collins, CO (US); Jamie Lee Johnson, Ft Collins, CO (US); Jason Michael Thompson, Broomfield, CO (US)

(73) Assignee: Otter Products, LLC, Fort Colins, CO (US)

( * ) Notice: Subject to any disclaimer, the term of this patent is extended or adjusted under 35 U.S.C. 154(b) by 0 days.

(21) Appl. No.: 13/043,205

(22) Filed: Mar. 8, 2011

(65) Prior Publication Data

US 2011/0157800 A1  Jun. 30, 2011

Related U.S. Application Data

(63) Continuation of application No. 12/251,161, filed on Oct. 14, 2008, now Pat. No. 7,933,122, which is a continuation-in-part of application No. 12/134,120, filed on Jun. 5, 2008, now abandoned.

(60) Provisional application No. 60/942,429, filed on Jun. 6, 2007.

(51) Int. Cl.
*G06F 1/16* (2006.01)

(52) U.S. Cl. ........... 361/679.55; 361/679.3; 361/679.56; 455/575.1; 455/575.8; 455/90.3; 206/320; 206/701

(58) Field of Classification Search ............. 361/679.55, 361/679.56
See application file for complete search history.

(56) References Cited

U.S. PATENT DOCUMENTS

| | | | |
|---|---|---|---|
| 2,392,787 A | 1/1946 | Vermot | |
| D216,853 S | 3/1970 | Schurman | |
| D220,233 S | 3/1971 | Schurman | |
| 3,590,988 A | 7/1971 | Hollar | |
| 4,352,968 A | 10/1982 | Pounds | |
| D275,822 S | 10/1984 | Gatland et al. | |
| D284,372 S | 6/1986 | Carpenter | |
| 4,733,776 A | 3/1988 | Ward | |
| 4,736,418 A | 4/1988 | Steadman | |
| 4,762,227 A | 8/1988 | Patterson | |
| 4,836,256 A | 6/1989 | Meliconi | |
| 5,025,921 A * | 6/1991 | Gasparaitis et al. | 206/320 |
| 5,092,459 A | 3/1992 | Uljanic et al. | |
| D327,646 S | 7/1992 | Hardigg et al. | |
| D329,747 S | 9/1992 | Embree | |
| D330,329 S | 10/1992 | Brightbill | |
| 5,175,873 A | 12/1992 | Goldenberg et al. | |
| D335,220 S | 5/1993 | Ward et al. | |
| D342,609 S | 12/1993 | Brightbill | |
| D347,324 S | 5/1994 | Dickinson | |
| D347,732 S | 6/1994 | Wentz | |
| D348,472 S | 7/1994 | Cyfko | |
| D353,048 S | 12/1994 | VanSkiver et al. | |
| 5,386,084 A * | 1/1995 | Risko | 174/564 |

(Continued)

FOREIGN PATENT DOCUMENTS

JP            08018637 A      1/1996

*Primary Examiner* — Anthony Q Edwards

(57) ABSTRACT

Disclosed is a three-layer protective enclosure that provides resistance to water, dust, dirt, and bump protection for sensitive computers. In one embodiment, an inner membrane layer is provided, which is a thin, flexible layer that protects portions of a computer and allows the user to interact with keyboards, push buttons and other interactive features of the computer. A protective hard shell fits tightly over the membrane and provides additional sealing and rigidity to the protective enclosure. A stretchable cushion layer is placed over the hard shell which conforms to the hard shell and seals moisture, dust and dirt from entering the hard shell. The stretchable cushion layer provides cushioning and also allows access to certain controls on the computer. In another embodiment, a touch screen cover may be used with, or without, a membrane over other portions of the computer.

8 Claims, 15 Drawing Sheets

U.S. PATENT DOCUMENTS

| | | |
|---|---|---|
| 5,388,692 A | 2/1995 | Withrow et al. |
| 5,499,713 A | 3/1996 | Huffer |
| D381,512 S | 7/1997 | Green |
| 5,648,757 A | 7/1997 | Vernace et al. |
| 5,681,122 A | 10/1997 | Burke |
| D386,611 S | 11/1997 | Sheu |
| D402,105 S | 12/1998 | Erickson |
| D409,374 S | 5/1999 | Laba et al. |
| D412,062 S | 7/1999 | Potter et al. |
| 5,923,752 A * | 7/1999 | McBride et al. ......... 379/433.11 |
| D413,202 S | 8/1999 | Schmitt et al. |
| D413,203 S | 8/1999 | Zurwelle et al. |
| D419,297 S | 1/2000 | Richardson et al. |
| D419,767 S | 2/2000 | Richardson et al. |
| D419,768 S | 2/2000 | Richardson et al. |
| 6,031,524 A | 2/2000 | Kunert |
| 6,041,924 A | 3/2000 | Tajima |
| 6,049,813 A | 4/2000 | Danielson et al. |
| D423,772 S | 5/2000 | Cooper et al. |
| 6,068,119 A | 5/2000 | Derr et al. |
| 6,082,535 A | 7/2000 | Mitchell |
| 6,094,785 A | 8/2000 | Montgomery et al. |
| D433,133 S | 10/2000 | Dyer |
| D433,798 S | 11/2000 | Weinstock |
| D439,407 S | 3/2001 | Parker |
| 6,201,867 B1 * | 3/2001 | Koike ...................... 379/433.11 |
| 6,215,474 B1 | 4/2001 | Shah |
| 6,239,968 B1 | 5/2001 | Kim et al. |
| 6,273,252 B1 | 8/2001 | Mitchell |
| 6,301,100 B1 | 10/2001 | Iwata |
| 6,313,892 B2 | 11/2001 | Gleckman |
| 6,313,982 B1 | 11/2001 | Hino |
| 6,317,313 B1 | 11/2001 | Mosgrove et al. |
| 6,388,877 B1 | 5/2002 | Canova, Jr. et al. |
| 6,415,138 B2 | 7/2002 | Sirola et al. |
| 6,445,577 B1 | 9/2002 | Madsen et al. |
| 6,456,487 B1 | 9/2002 | Hetterick |
| 6,471,056 B1 | 10/2002 | Tzeng |
| D465,330 S | 11/2002 | Parker |
| D470,659 S | 2/2003 | Story et al. |
| 6,519,141 B2 | 2/2003 | Tseng et al. |
| 6,536,589 B2 | 3/2003 | Chang |
| D472,384 S | 4/2003 | Richardson |
| 6,617,973 B1 | 9/2003 | Osterman |
| 6,646,864 B2 | 11/2003 | Richardson |
| 6,659,274 B2 | 12/2003 | Enners |
| 6,665,174 B1 | 12/2003 | Derr et al. |
| 6,701,159 B1 | 3/2004 | Powell |
| 6,731,913 B2 | 5/2004 | Humphreys et al. |
| 6,839,430 B2 | 1/2005 | Kwak |
| 6,926,141 B2 | 8/2005 | Montler |
| 6,954,405 B2 | 10/2005 | Polany et al. |
| 6,962,454 B1 | 11/2005 | Costello |
| D513,123 S | 12/2005 | Richardson et al. |
| 6,980,777 B2 * | 12/2005 | Shepherd et al. ............ 455/90.3 |
| D513,451 S | 1/2006 | Richardson et al. |
| D514,808 S | 2/2006 | Morine et al. |
| D515,588 S | 2/2006 | Kirkwood |
| 6,995,976 B2 | 2/2006 | Richardson |
| D516,309 S | 3/2006 | Richardson et al. |
| D516,553 S | 3/2006 | Richardson et al. |
| D516,556 S | 3/2006 | Graziano |
| D516,807 S | 3/2006 | Richardson et al. |
| 7,054,441 B2 | 5/2006 | Pletikosa |
| 7,061,762 B2 | 6/2006 | Canova, Jr. et al. |
| 7,069,063 B2 | 6/2006 | Halkosaari et al. |
| D526,780 S | 8/2006 | Richardson et al. |
| D530,079 S | 10/2006 | Thomas et al. |
| 7,146,701 B2 | 12/2006 | Mahoney et al. |
| 7,158,376 B2 | 1/2007 | Richardson et al. |
| 7,180,735 B2 | 2/2007 | Thomas et al. |
| 7,194,291 B2 | 3/2007 | Peng |
| D542,524 S | 5/2007 | Richardson et al. |
| 7,230,823 B2 | 6/2007 | Richardson et al. |
| 7,236,588 B2 | 6/2007 | Gartrell |
| 7,290,654 B2 | 11/2007 | Hodges |
| D557,264 S | 12/2007 | Richardson et al. |
| D557,897 S | 12/2007 | Richardson et al. |
| 7,312,984 B2 | 12/2007 | Richardson et al. |
| 7,343,184 B2 | 3/2008 | Rostami |
| 7,400,917 B2 | 7/2008 | Wood et al. |
| 7,418,278 B2 | 8/2008 | Eriksson et al. |
| 7,428,427 B2 * | 9/2008 | Brunstrom et al. ........ 455/550.1 |
| D581,155 S | 11/2008 | Richardson et al. |
| D581,421 S | 11/2008 | Richardson et al. |
| 7,449,650 B2 | 11/2008 | Richardson et al. |
| D587,008 S | 2/2009 | Richardson et al. |
| 7,495,895 B2 | 2/2009 | Carnevali |
| D589,016 S | 3/2009 | Richardson et al. |
| D593,319 S | 6/2009 | Richardson et al. |
| D593,746 S | 6/2009 | Richardson et al. |
| 7,558,594 B2 * | 7/2009 | Wilson ...................... 455/550.1 |
| D597,301 S | 8/2009 | Richardson et al. |
| D601,799 S | 10/2009 | Andre et al. |
| 7,609,512 B2 | 10/2009 | Richardson et al. |
| D603,602 S | 11/2009 | Richardson et al. |
| 7,623,898 B2 * | 11/2009 | Holmberg ................. 455/575.8 |
| D605,850 S | 12/2009 | Richardson et al. |
| 7,663,878 B2 | 2/2010 | Swan et al. |
| 7,663,879 B2 | 2/2010 | Richardson et al. |
| 7,688,580 B2 | 3/2010 | Richardson et al. |
| D613,282 S | 4/2010 | Richardson et al. |
| 7,907,394 B2 | 3/2011 | Johnson et al. |
| 7,933,122 B2 * | 4/2011 | Richardson et al. ..... 361/679.55 |
| 2002/0065054 A1 | 5/2002 | Humphreys et al. |
| 2002/0079244 A1 | 6/2002 | Kwong |
| 2002/0086702 A1 | 7/2002 | Lai et al. |
| 2003/0151890 A1 | 8/2003 | Huang et al. |
| 2004/0014506 A1 | 1/2004 | Kemppinen |
| 2006/0255493 A1 | 11/2006 | Fouladpour |
| 2007/0158220 A1 | 7/2007 | Cleereman et al. |
| 2008/0316687 A1 | 12/2008 | Richardson et al. |
| 2009/0283184 A1 | 11/2009 | Han |
| 2010/0093412 A1 | 4/2010 | Serra et al. |
| 2010/0096284 A1 * | 4/2010 | Bau .............................. 206/320 |
| 2010/0104814 A1 * | 4/2010 | Richardson et al. .......... 428/156 |
| 2010/0122756 A1 * | 5/2010 | Longinotti-Buitoni ....... 150/165 |
| 2010/0203931 A1 * | 8/2010 | Hynecek et al. ........... 455/575.8 |

* cited by examiner

PROTECTIVE ENCLOSURE FOR ELECTRONIC DEVICE

CROSS-REFERENCE TO RELATED APPLICATION

This application is a continuation application of U.S application Ser. No. 12/251,161, entitled "Protective Enclosure for a Computer" by Curtis R. Richardson et al., filed Oct. 14, 2008, which is a continuation-in-part of U.S. application Ser. No. 12/134,120, entitled "Protective Enclosure for an Electronic Device," by Curtis R. Richardson et al., filed Jun. 5, 2008, which application claims benefit of and priority to U.S. Provisional Patent Application Ser. No. 60/942,429, entitled "Protective Enclosure for an Electronic Device" by Curtis R. Richardson, et al., filed Jun. 6, 2007, and U.S. Provisional Patent Application Ser. No. 61/029,432, entitled "Protective Enclosure for an Electronic Device" by Curtis R. Richardson, et al., filed Feb. 18, 2008, the entire contents of which are specifically incorporated herein by reference for all that they disclose and teach.

BACKGROUND OF THE INVENTION

Various types of electronic devices currently exist for communications and entertainment purposes. These include various types of computers, including laptop computers, handheld computers, ultra-mobile computers, tablet computers, MP3 players that play music, video players, smart phones, other types of communication devices such as walkie talkies, navigational devices such as GPS devices and other types of electronic devices. These devices often utilize touch screens, interactive panels including, but not limited to, capacitive coupled interfaces, interactive touch screens, keyboards, scroll wheels, tilt switches, push-button switches and other interactive controls. Due to the sensitive nature of these electronic devices, it is desirable to provide protection for these devices so that they can be used in various environments.

SUMMARY OF THE INVENTION

An embodiment of the present invention may therefore comprise a protective enclosure for a computer comprising: a flexible membrane that is molded to fit over at least a front portion of the computer that allows interactive access to controls on the front portion of the computer; a hard shell cover that fits over the flexible membrane and the computer and that is formed to provide openings that allow a user to access the flexible membrane to have interactive access to the controls of the computer, the hard shell cover providing rigidity to the protective enclosure; a stretchable cushion layer that is disposed over the hard shell cover that has sufficient elasticity to substantially confirm to the hard shell cover and provide cushioning to the protective enclosure.

An embodiment of the present invention may further comprise a protective enclosure for a computer comprising: a hard shell cover that fits over the computer and that is formed to provide openings that allow access to controls of the computer; a stretchable cushion layer that is disposed over the hard shell cover that has sufficient elasticity to stretch over the hard shell cover and substantially conform to an outer surface of the hard shell cover to cushion the hard shell cover and absorb shocks that would otherwise be transmitted to the computer.

An embodiment of the present invention may further comprise a protective enclosure for a computer that has a touch screen comprising: a hard shell cover that fits over the computer and that is formed to provide at least one opening that is aligned with the touch screen; a touch screen cover that is attached to the hard shell cover, the touch screen cover being sufficiently thin and disposed sufficiently close to the touch screen when the computer is disposed in the protective enclosure to allow activation of the touch screen through the touch screen cover; a stretchable cushion layer that is disposed over the hard shell cover that has sufficient elasticity to stretch over the hard shell cover and substantially conform to an outer surface of the hard shell cover to cushion the hard shell cover and absorb shocks that would otherwise be transmitted to the computer.

An embodiment of the present invention may further comprise a method of protecting a computer that has a keyboard by surrounding the electronic device with a protective enclosure comprising: providing a hard shell case having an opening for the keyboard; placing the computer in the hard shell case so that the opening is aligned with the keyboard; providing a stretchable cushion layer that absorbs shocks and has sufficient elasticity to stretch over the hard shell case and substantially conform to an outer surface of the hard shell case; placing the stretchable cushion layer over the hard shell case to provide the protective enclosure.

An embodiment of the present invention may further comprise a method of protecting an electronic device that has a keyboard by surrounding the computer with a protective enclosure comprising: providing a hard shell case having an opening for the keyboard; providing a flexible membrane made from a thin flexible material that allows actuation of the keyboard through the flexible membrane; placing the membrane over the keyboard; placing the computer in the hard shell case so that the opening for the keyboard and the flexible membrane disposed over the keyboard are aligned with the keyboard and the flexible membrane is held in place by the hard shell case; providing a stretchable cushion layer that absorbs shocks and has sufficient elasticity to stretch over the hard shell case and substantially conform to an outer surface of the hard shell case; placing the stretchable cushion layer over the hard shell case to provide the protective enclosure.

An embodiment of the present invention may further comprise a method of protecting a computer that has a touch screen by surrounding the computer with a protective enclosure comprising: providing a hard shell case having an opening for the touch screen; placing the computer in the hard shell case so that the opening is aligned with the touch screen; providing a touch screen cover made from a clear, hard material that is sufficiently thin to allow actuation of the touch screen through the touch screen cover; attaching the touch screen cover to the hard shell case over the opening so that the touch screen cover is disposed adjacent to the touch screen when the computer is disposed in the protective hard shell case and the touch screen can be operated through the touch screen cover; providing a stretchable cushion layer that absorbs shock, and has sufficient elasticity to stretch over the hard shell case and substantially conform to an outer surface of the hard shell case; placing the stretchable cushion layer over the hard shell case to provide the protective enclosure.

DETAILED DESCRIPTION OF THE EMBODIMENTS

Figure 1:
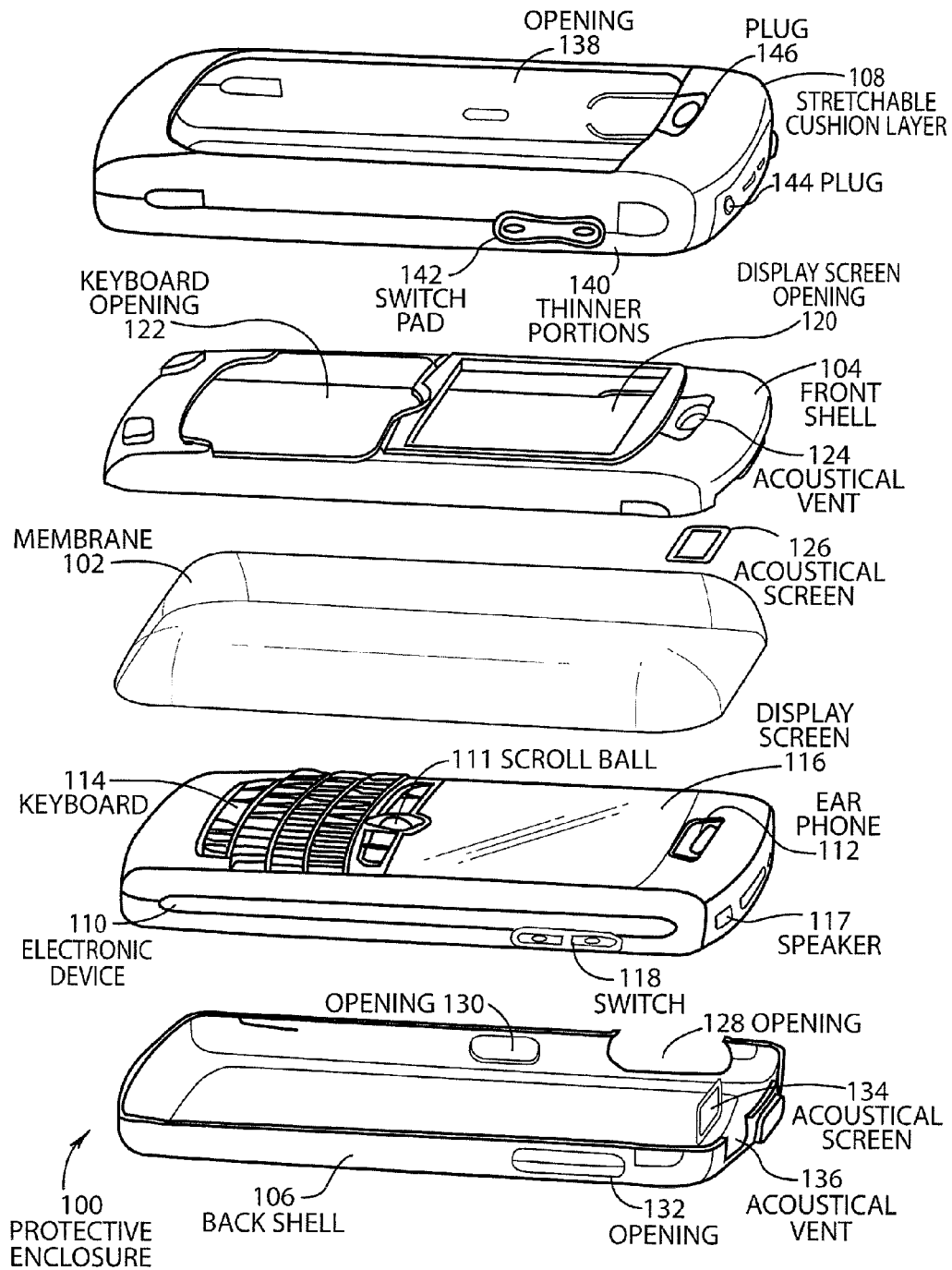
FIG. 1 is an exploded view of one embodiment of a protective enclosure.

FIG. 1 shows an exploded view of one embodiment of a protective enclosure 100. The protective enclosure includes a membrane 102, a front shell 104, a back shell 106 and a stretchable cushion layer 108. When assembled, the protective enclosure substantially surrounds and provides protection for electronic device 110. Electronic device 110 can be any type of electronic device that requires interactivity with a user of the device, including various types of MP3 players, video players, cell phones, smart phones, satellite phones, walkie talkies, GPS navigational devices, telematics devices, pagers, monitors, personal data assistants, bar code scanners, as well as various types of computers, including portable computers, laptop computers, handheld computers, ultra-mobile computers, tablet computers, and various hybrid devices that combine two or more of these functions. In addition, these devices may operate with only a touch screen interface or only with a keyboard or other type of manual input and are not limited to devices that includes keyboards or buttons, as well as a touch screen. The membrane 102 can be made from a soft, plastic layer such as a soft, thin Lexan (polycarbonate), PVC, urethane, or silicon material that can be molded, such as by thermoforming, casting, stretching, heating, or injection molding, or otherwise shaped to fit to the front surface of the electronic device 110 and other surfaces of the electronic device 110. The membrane has a thickness on the order of 0.004 to 0.020 inches. The membrane 102 may be made from a single material or multiple materials that are welded, glued or formed together into a single membrane 102. For example, for the portion of the membrane 102 that is disposed over the display screen 115, it may be desirable to use a clear, thin, hard layer of glass or plastic to provide a clear, transparent material over the display screen that protects the display screen from scratches. The other part of the membrane 102 may be made of a thin layer of Lexan (polycarbonate), PVC or a silicon material that is highly flexible so that a keyboard and other buttons may be pressed through the membrane 102.

Similarly, if the electronic device 112 has a capacitive interface, such those used on iPod devices, a separate material, such as Lexan, or other types of polycarbonates, that are on the order of 0.010, but may be in the range of 0.004-0.020, inch thick, may be used for the capacitive interface. Alternatively, PVC or silicon may be used with a cross sectional thickness that allows interactability. With regard to the thickness of various materials to be used as a capacitive coupling interface, U.S. Pat. Nos. 6,646,864, 6,995,976, 7,158,376, and 7,180,735, and U.S. patent application Ser. Nos. 11/270,732, 11/420,683, 11/456,157, 11/466,342 and 11/676,986 are specifically incorporated herein by reference for all that they disclose and teach. With regard to the various types of materials and thicknesses of those materials for use with an interactive touch screen, the above-referenced applications disclose these materials and thicknesses. For example, it can be envisioned that a device may have a keyboard or a number of buttons, together with a capacitive interface and a touch screen in which various combinations of materials can be used. For example, a thin layer of glass may be used for the touch screen.

Further, it may be desirable to not use the membrane 102, but rather, leave the keyboard or buttons open, through the keyboard opening 122, to allow better access to the keys on the keyboard 114. Although elimination of the membrane 102 may subject the electronic device 110 to contamination of dust and dirt and subject the electronic device 110 to damaging water, some users may desire to have open access to the keyboard 114. In that regard, the second and third layer of protection, i.e. the assembled front shell 104 and back shell 106 with the stretchable cushion layer 108, provides protection against dropping and crushing of the device.

In addition, the membrane 102, illustrated in FIG. 1, may be made so that just the area around the keyboard opening 122 is open to allow direct access to the keyboard 114, while the other areas that are covered by the membrane 102 remain covered. In addition, various portions of the membrane can be made clear, translucent, opaque or any desired color, or any combination of these alternatives. The membrane 102 is shown as covering a front portion of the electronic device 110, but can also be made to wrap around a portion of, or all of, the backside of the electronic device 110 and be at least partially sealed together, especially if a self-adhering material is used for the membrane 102. For example, if a camera is included on the backside of the electronic device 110, a clear portion of the membrane 102 can be used to cover a camera lens (not shown). The membrane 102 can also have some elasticity so that the membrane fits tightly to the electronic device 110. The membrane 102 can be thermoformed or otherwise molded to fit the specific shape of all, or a portion of, the surfaces of the electronic device 110, to provide a tight, form fit to the electronic device 110. The molding or thermoforming process can be quickly and easily performed by simply generating a mold of the surfaces of the electronic device 110 to be covered and using that mold to generate a thermoforming mold or other mold. In this manner, a precisely formed membrane that fits tightly to the surfaces of the electronic device 110 can be simply and easily formed. Overlapping flaps (not shown) can also help to seal the membrane to the electronic device.

The membrane 102 may also have openings. For example, some electronic devices, such as Blackberry Smart Phones, include scroll balls on the front. An opening in the membrane 102 can be provided to allow access to the scroll ball. The membrane 102 can be thermomolded to fit tightly in the opening around the scroll ball to provide as much water and dust protection as possible. In addition, openings may be provided in the membrane 102 for microphones and speakers, such as speaker 117 and earphone 112, to allow for proper transmission of audio waves to the microphone and from the speakers. Some electronic devices have adequate microphones and speakers so that openings do not have to be provided in the membrane 102. For the instances in which an opening must be formed in the membrane 102 to accommodate speakers and microphones, an acoustical screen, such as acoustical screen 126, can be placed on an opening in the membrane 102. The acoustical screen may be made of a material such as Gortex, or other material, that allows transmission of acoustical waves while also preventing the flow of water, or other contaminants, through the acoustical vent 124.

As also shown in FIG. 1, the front shell 104 fits snuggly over the membrane 102 and snaps together with the back shell 106. The assembly of the front shell 102 and back shell 106 form a hard shell housing 150 that has a thickness on the order of 0.030 to 0.060 inches. The front shell 104 and the back shell 106 can be made of a polycarbonate, ABS materials, propylene, thermal plastics, metals, composite materials, and other rigid materials used in injection molding. The firm fit of the front shell 104, and portions of the back shell 106, to the membrane 102 and electronic device 110, helps to seal the hard shell 150 to the membrane 102, which provides water resistance and prevents dirt and dust from entering the membrane 102. The molded, snug fit of the membrane 102 to the electronic device 110, as well as the tight fit of the front shell 104 and back shell 106 to the electronic device 110 and the membrane 102, helps to seal the electronic device 110 within the protective enclosure 100. Further, the tight fit of the stretchable cushion layer 108 also helps to keep water, dirt and dust out. Around each of the openings in the front shell 104 and back shell 106 that are adjacent to the membrane 102, a small ridge can be formed that applies additional pressure to the membrane 102 to further seal the membrane 102 to the front shell 104 and back shell 106. Each of the small ridges around these openings, such as the display screen opening 120 and the keyboard opening 122, slightly deforms and seals the edge of the openings to the membrane 102, which helps in preventing the entry of dust, dirt or moisture into the hard shell 150 and the electronic device 110.

As further shown in FIG. 1, the front shell 104 is formed to provide a keyboard opening 122 and a display screen opening 120 that allow access to the shaped membrane 102 that covers the keyboard 114 and display screen 115 of the electronic device 110. As mentioned above, the front shell 104 is also formed to provide an acoustical vent 124. The acoustical screen 126 may be mounted in the acoustical vent 124 to prevent the passage of water, dust or dirt either onto the membrane 102 or onto the earphone 112 of the electronic device 110. Acoustical screen 126 can be made of a material that prevents the passage of dust through the acoustical screen 126 or may also be made of a material that prevents the passage of both dust and water through the acoustical screen 126. Some degree of water protection is provided by a waterproof acoustical screen. However, such screens may not have the ability to transmit acoustical signals as well as other screens that do not provide water protection. In many instances, the earphone 112 and speaker 117 are sufficiently loud that apertures do not have to be formed in the membrane 102 so that the acoustical waves are transmitted through the membrane 102. The thickness and selection of the materials for the membrane 102 may allow the membrane to be aperture free. For example, the membrane 102 may be thermoformed or otherwise molded so the membrane 102 may be sufficiently thin in the areas that cover the earphone 112 and speaker 117 to allow the transmission of acoustical waves through the membrane so that the user may adequately hear the acoustical transmissions. In addition, the membrane 102 may also be made sufficiently thin over the area that covers the microphone to allow acoustical voice transmissions to be adequately received by the microphone. Also, other types of materials may be used over the earphones and microphones that allow transmission of acoustical waves. Further, some personal electronic devices do not require any type of keyboard, but operate simply by using a touch screen. For these types of devices, a membrane 102 is not required, but rather a display screen cover that comprises a thin, hard plastic or glass material can be used that is either removeably or permanently attached to the front shell 104.

The back shell 106, illustrated in FIG. 1, snaps tightly onto the front shell 104. The back shell 106 has an opening 132 that allows access to tilt or double-button switch 118 that allows adjustment of the volume of the electronic device 110. The acoustical vent 136 provides an opening in the back shell 106 for the speaker 117. An acoustical screen 134 can also be optionally connected over the opening of the acoustical vent 136 to prevent water and dust from entering the enclosure of the front shell 104 and back shell 106 when the shells are snapped together. Another opening 128 is also formed in the back shell 106 that allows access to electrical ports (not shown) in the electronic device 110. An opening may be formed in the membrane 102 to allow electrical cables to access the electrical ports in the electronic device 110. Alternatively, the membrane 102 may be formed so that the edge of the membrane 102 does not extend downwardly to the electronic ports on the electronic device 110. Another opening 130 may also be formed in the back shell 106 to allow access to a button (not shown) on the side of the electronic device 110. Again, an opening may be formed in the membrane 102, or the membrane may not extend to the position of the "enter" button.

As indicated above, the material of the membrane 102 may be sufficiently thin to allow a user to interact with a touch screen on the electronic device 110. Further, the material of the membrane 102 that can be accessed by the user through the display screen opening 120 can be a different material that may allow a user to interface with a capacitive interactive screen, or a touch screen, such as a harder and thinner material that is attached the membrane 102, which may include a polycarbonate, a hard acrylic material, any other hard, thin plastic, or glass. A hard, thin plastic or glass layer can also be removeably or permanently connected directly to the display screen opening 120 of the front shell 104. Such a protective layer may be used in addition to the membrane 102, or in place of the membrane 102, over the display screen 115 of the electronic device 110. The keyboard opening 122 allows access to the portion of the membrane 102 that covers the keyboard 114 of the electronic device 110. The membrane 102 can be molded, thermoformed or otherwise formed to the shape of the keys and is a flexible, thin material that allows the user to easily access and utilize the keys of the keyboard 114. Alternatively, some keyboards are sufficiently flat that thermoforming the membrane 102 to the keyboard is not needed. Both the thinness and flexibility of the membrane 102 over the keyboard area allows the user to access the keyboard 114 in a manner that allows easy tactile input similar to the tactile input that is achievable through direct contact with the keyboard 114. Plastic materials that have self-adhering properties, such as polypropylene, polyethylene, etc. can be used for the membrane 102. The advantage of the use of such devices is that greater sealing occurs between the electronic device 110 and the membrane 102 to further seal out dust, dirt and moisture.

As also illustrated in FIG. 1, a stretchable cushion layer 108 is provided that fits snugly over the assembled hard shell 150 that includes the front shell 104 and back shell 106. The stretchable cushion layer 108 provides cushioning in a drop situation and fits snugly over portions of the outside of the assembled hard shell 150. The softness specifications can vary, as long as the softness does not interfere with the functionality of the protective enclosure 100. The stretchable cushion layer 108 can be made of a variety of thermoplastic materials (such as rubber or silicon), urethane, or other material that is capable of stretching sufficiently to allow the hard shell 150 to slide into the opening 138 of the stretchable cushion layer 108. The stretchable cushion layer 108 has a modulus of elasticity, which varies, but allows the stretchable cushion layer 108 to conform to the assembled hard shell 150. The stretchable cushion layer may include pads, such as tilt switch/push button pad 142, that are connected to the stretchable cushion layer 108 with a thinner portion 140 to allow actuation of the switches. The pads, such as pad 142, can then be depressed by a user to activate a tilt switch or push button switch, such as tilt/push button switch 118 on the electronic device 110. Opening 132 allows the pad 142 to directly access switch 118 for activation by a user. The thinner portion 140 allows the pad 142 to easily flex with respect to the stretchable cushion layer 108. Other pads can also be incorporated in the stretchable cushion layer that allow a user to interface with various controls on the electronic device 110.

Figure 2:
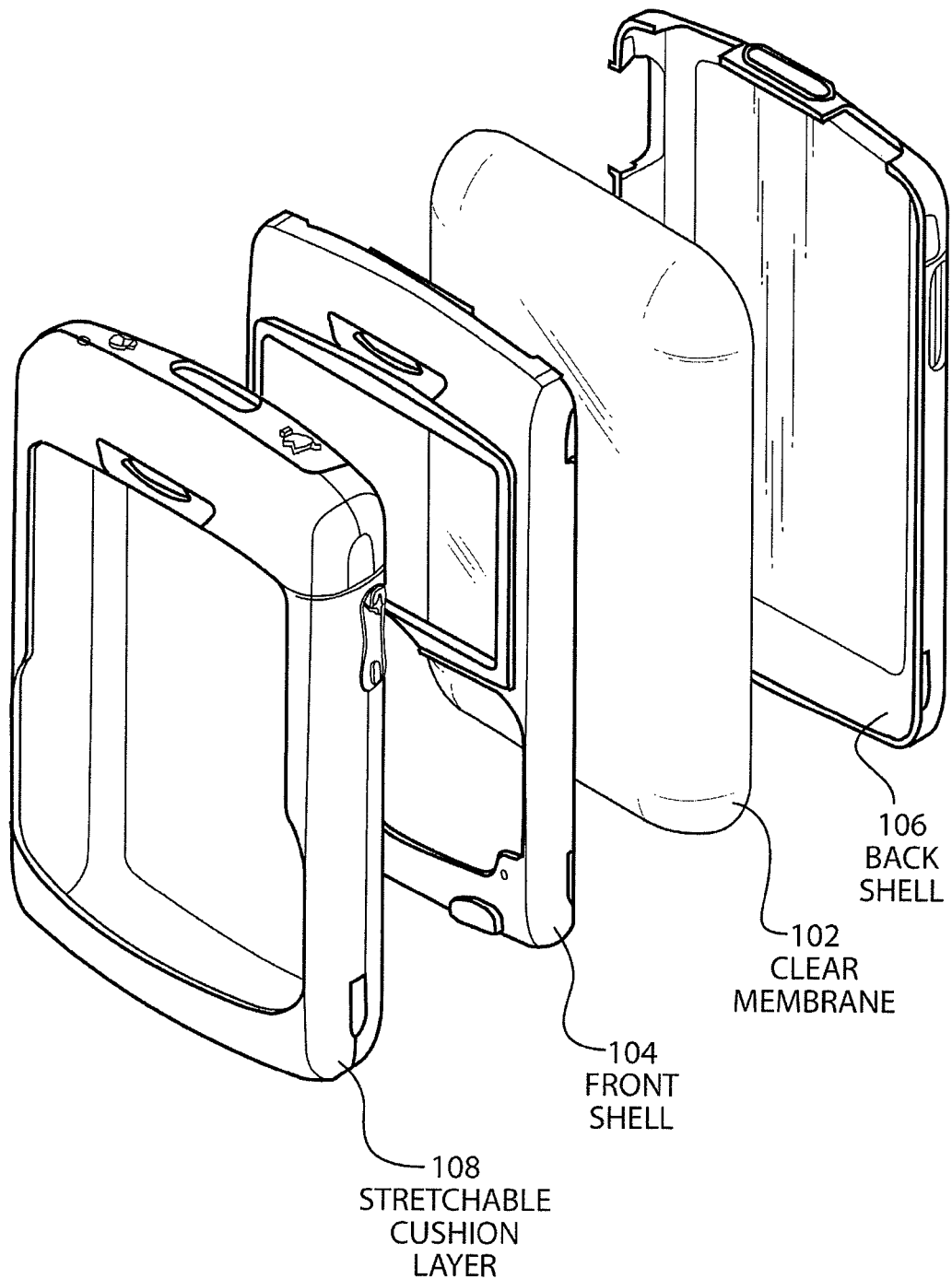
FIG. 2 is a line drawing of an exploded view of the embodiment of FIG. 1.

FIG. 2 is a line drawing illustrating the clear membrane 102, the front shell 104 and the back shell 106. In addition, FIG. 2 illustrates the stretchable cushion layer 108 that at least partially covers the assembly of the clear membrane 102, the front shell 104 and the back shell 106.

Figure 3:
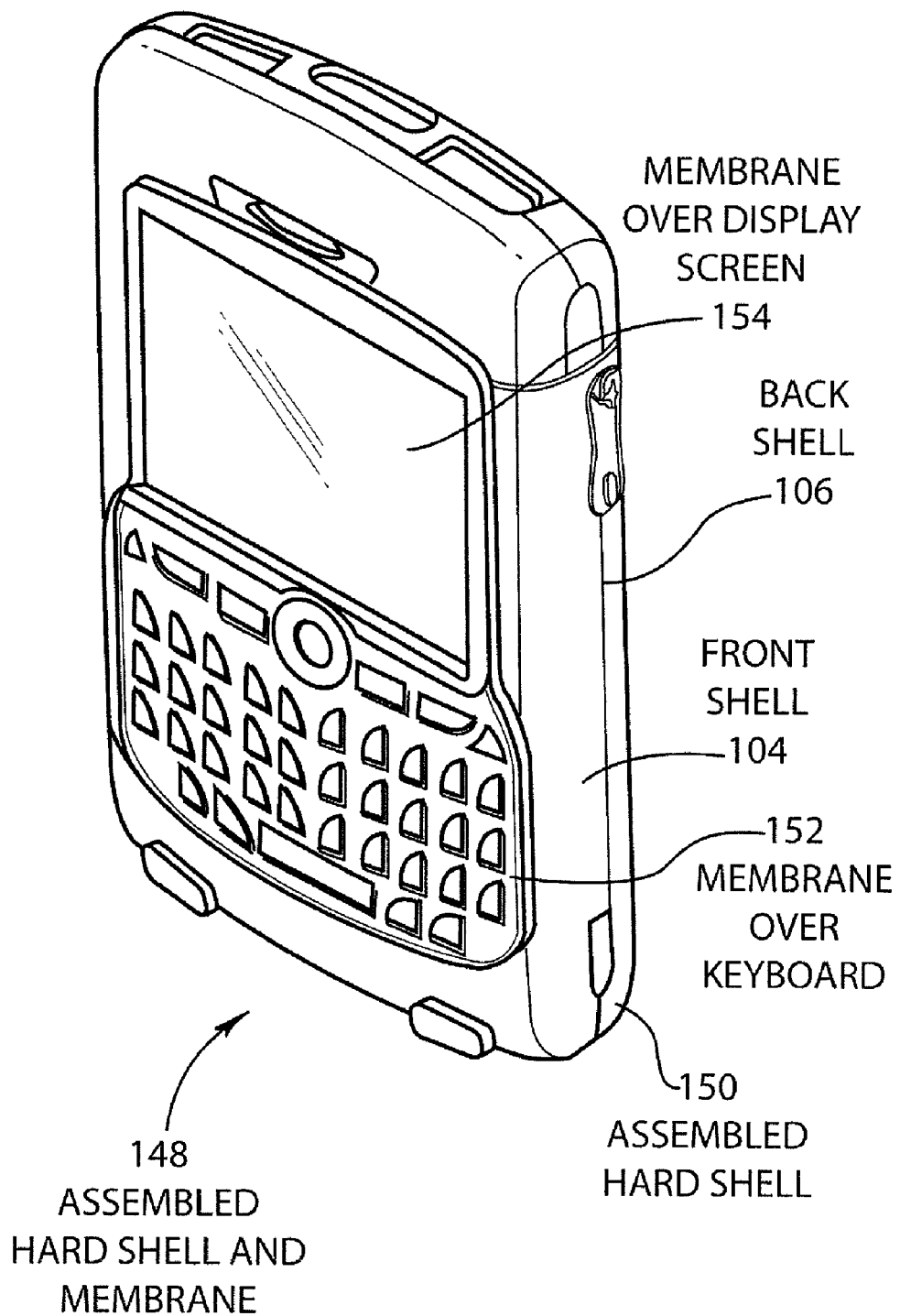
FIG. 3 is an illustration of one embodiment of the assembled hard shell and membrane.

FIG. 3 is an illustration of the assembly of the membrane 102 and the assembled hard shell 150. As shown in FIG. 3, the assembled rigid hard shell 150 provides a secure, rigid enclosure for the electronic device 110. As can be seen in FIG. 3, the portion of the membrane 150 that is disposed over the display screen of the electronic device is accessible through the display screen opening 120 in the front shell 104. Similarly, the portion of the membrane 152 that is disposed over the keyboard is accessible through the keyboard opening 122 in the front shell 104. As shown in FIG. 3, the back shell 106 is connected to the front shell 104. The front shell 104 and back shell 106 may be coupled together by a snap connection provided on the edge of the front shell 104 and the back shell 106. The snug fit of the front shell 104 and the back shell 106 over the membrane 102 creates a secure environment for the enclosure 100.

Figure 4:
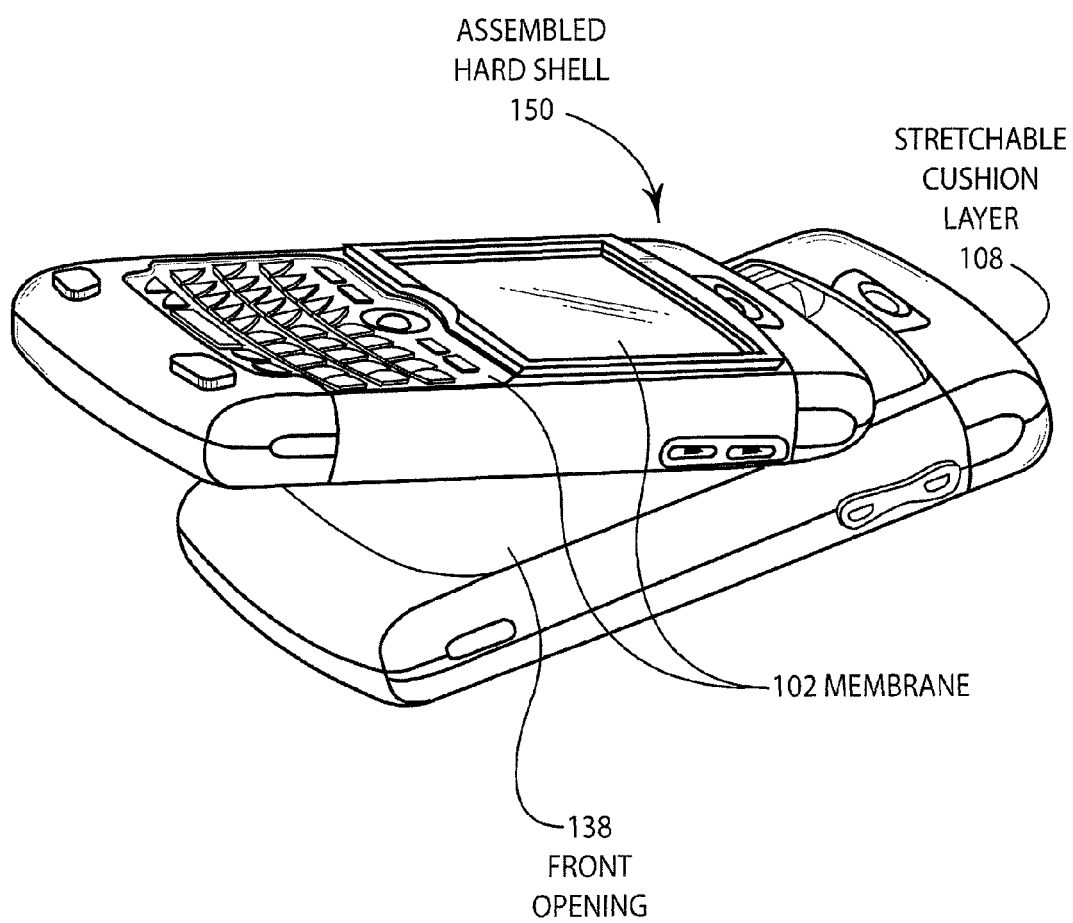
FIG. 4 is an illustration of one embodiment of the assembled hard shell and membrane being inserted into a stretchable cushion layer.

FIG. 4 is an illustration of the assembled hard shell 150 and membrane 102 being inserted in the stretchable cushion layer 108. As shown in FIG. 4, the assembled hard shell 150 is placed through the front opening 138 of the stretchable cushion layer 108. The stretchable cushion layer 108 is resilient and has an elasticity that allows the assembled hard shell 150 to be inserted through the front window of the stretchable cushion layer 108.

Figure 5:
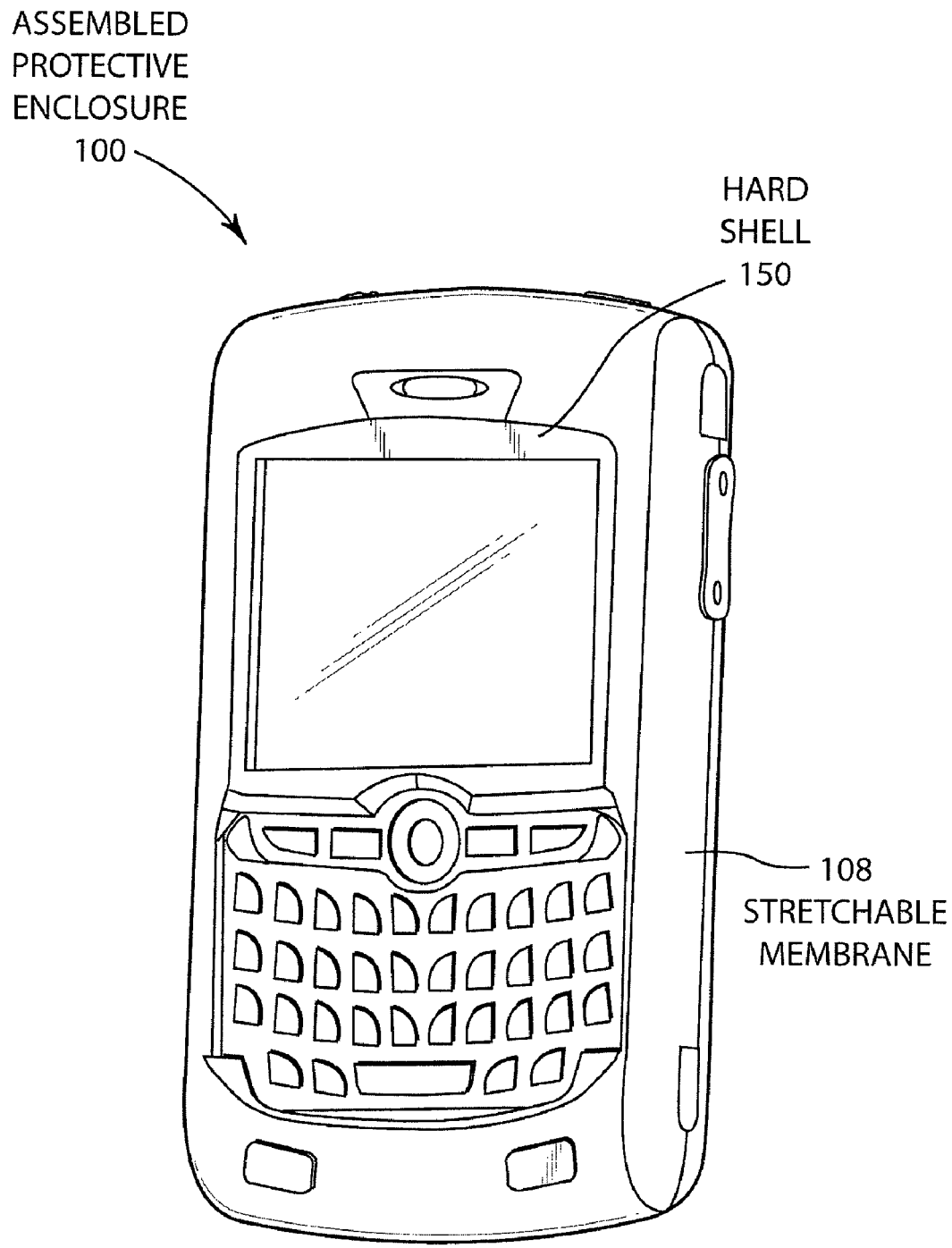
FIG. 5 is an illustration of one embodiment of the assembled protective enclosure.

FIG. 5 is an illustration of an embodiment of the assembled protective enclosure 100. As illustrated in FIG. 5, the stretchable membrane layer 108 surrounds the assembled hard shell 150. The stretchable cushion layer 108 has an elasticity that tightly holds the assembled hard shell 150 together in a cushion layer 108. The elasticity of the stretchable cushion layer 108 prevents the assembled hard shell 150 from separating in a drop situation. In addition, the elasticity of the stretchable cushion layer 108 provides a tight fit, which further adds to the water resistance of the protective enclosure 100. As shown in FIG. 5, the entire back portion of the stretchable cushion layer is sealed, which increases the water, dust and dirt resistance of the protective enclosure 100. In other embodiments, openings may be formed in the back portion that reduce the water, dust and dirt resistance of the protective enclosure 100. As disclosed above, the stretchable cushion layer 108 provides cushioning protection for the assembled protective enclosure 100. The assembled hard shell 150 provides stiffness and structural rigidity to the assembled protective enclosure 100 that further protects the electronic device 110. The combination of the membrane layer 102, the hard shell 150 and the cushion layer 108 provides water resistance, dust and dirt protection, and allows the user easy access to the electronic device 110. The thickness of the assembled protective enclosure 100 is approximately 0.10 to 0.15 inches. As such, the protective enclosure 100 does not add substantially to the bulkiness of the electronic device 110 while still providing water, dust and dirt resistance, and bump protection. Because the membrane layer is thin, activation of the keypads or other buttons and display screen, which may be a touch screen, is not significantly affected. If the membrane layer 102 becomes scratched or contaminated in some fashion, the membrane layer 102 can be easily replaced by simply removing the stretchable cushion layer 108, the hard shell case 150 and peeling the membrane 102 from the electronic device 110. Replacement membranes 102 can be provided for use with the protective enclosure 100.

Figure 6:
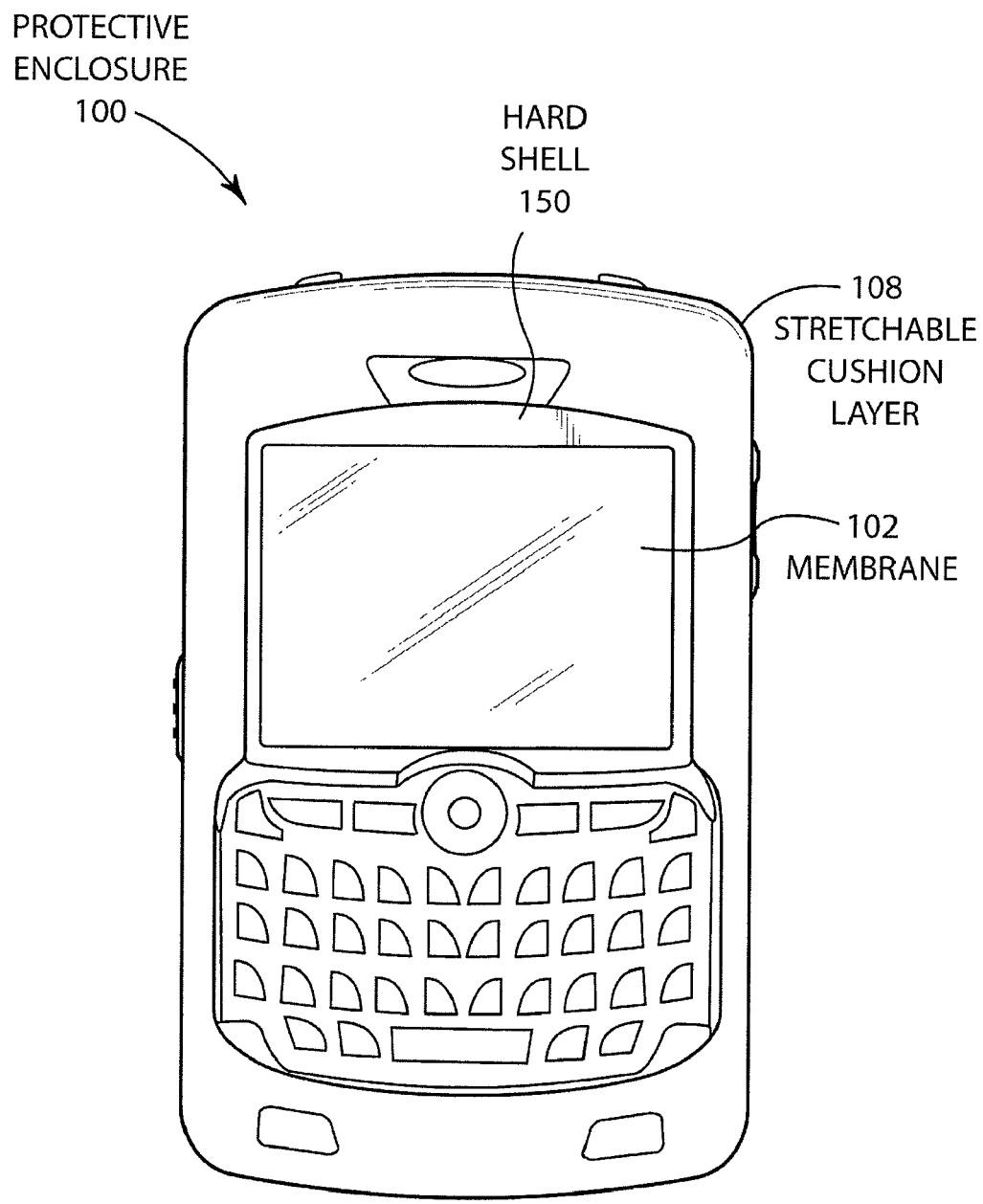
FIG. 6 is a front view of the embodiment of the protective enclosure illustrated in FIG. 5.

FIG. 6 is a front view of the protective enclosure 100. As can be seen in FIG. 6, the front shell 104 is not fully covered by the stretchable cushion layer 108. Front shell 104 appears around the opening 138 in the cushion layer 138. The front shell 104, as well as the back shell 106, can be made to have a different color than the stretchable cushion layer 108. For example, the front shell 104 and the back shell 106 can be made of a bright yellow plastic, or other color, while the stretchable cushion layer 108 may be black, gray or any other color, to provide sharp contrast which is pleasant and appealing. The stretchable cushion layer 108 can be made from a thermoplastic rubber or silicon material that has a thickness of approximately 0.050 to 0.100 inches. Colorant can be added to these materials that does not affect the performance of these materials, so as to obtain the desired color of the stretchable cushion layer 108, front shell 104 and back shell 106. The clear membrane may also be colored to provide a transparent, translucent or opaque membrane layer in portions of, or all of, the membrane 102.

Figure 7:
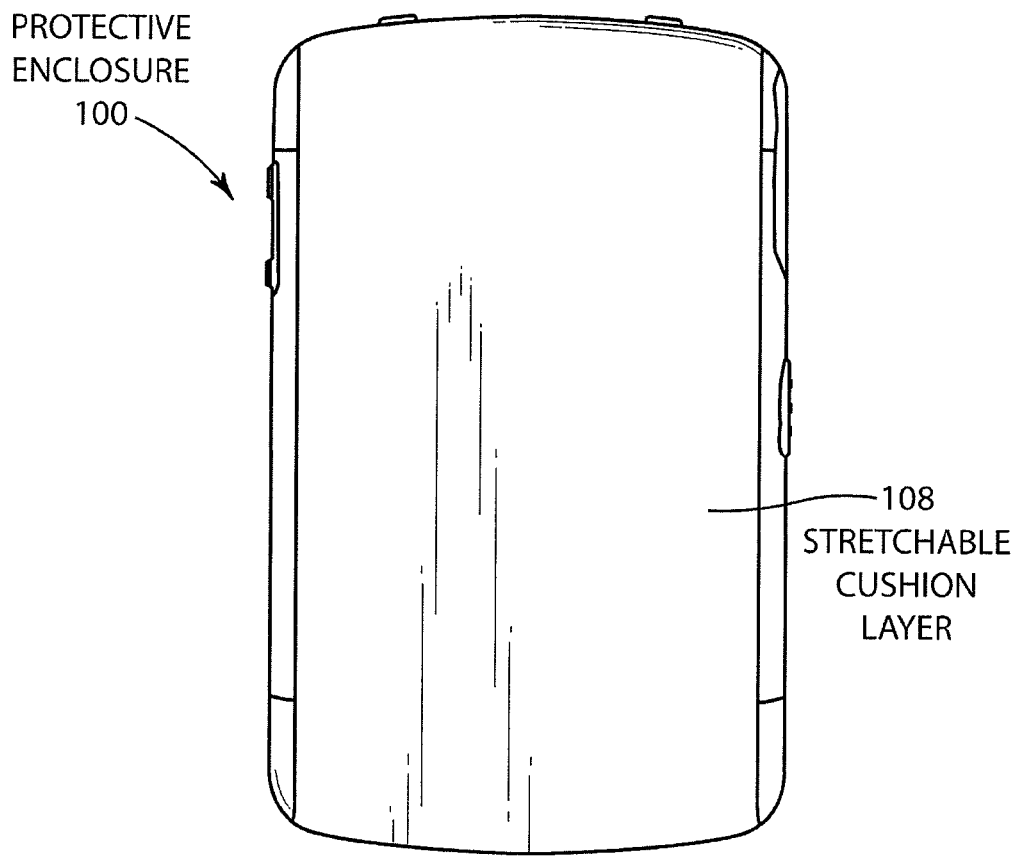
FIG. 7 is a back view of the embodiment of the protective enclosure illustrated in FIG. 5.

FIG. 7 is a back view of the protective enclosure 100. As shown in FIG. 7, the back of the stretchable cushion layer 108 provides cushioning to the back and corners of the electronic device 110.

Figure 8:
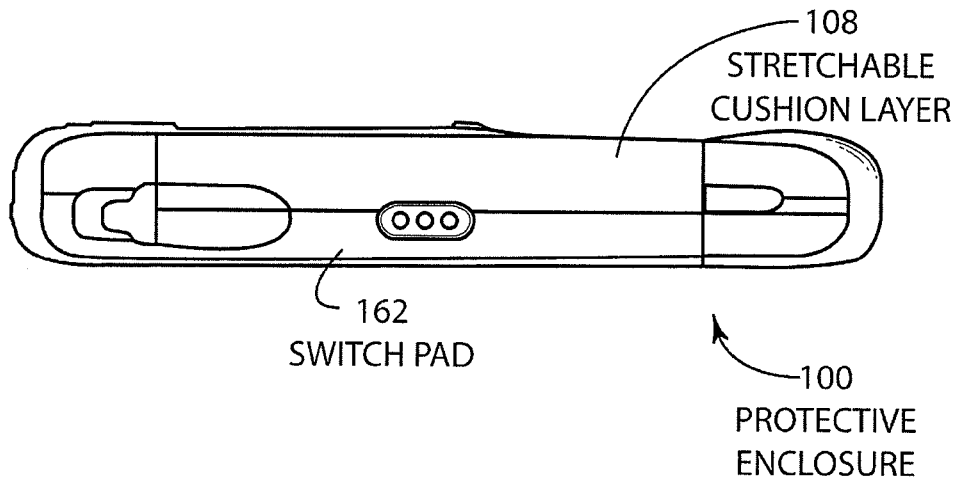
FIG. 8 is a right side view of the embodiment of the protective enclosure illustrated in FIG. 5.

FIG. 8 is a left side view of the protective enclosure 100. As can be seen in FIG. 8, switch pad 162, in the stretchable cushion layer 108, is aligned with opening 130 in the back shell 106 (FIG. 1) to allow user access to a push switch, such as an enter switch on the electronic device 110.

Figure 9:
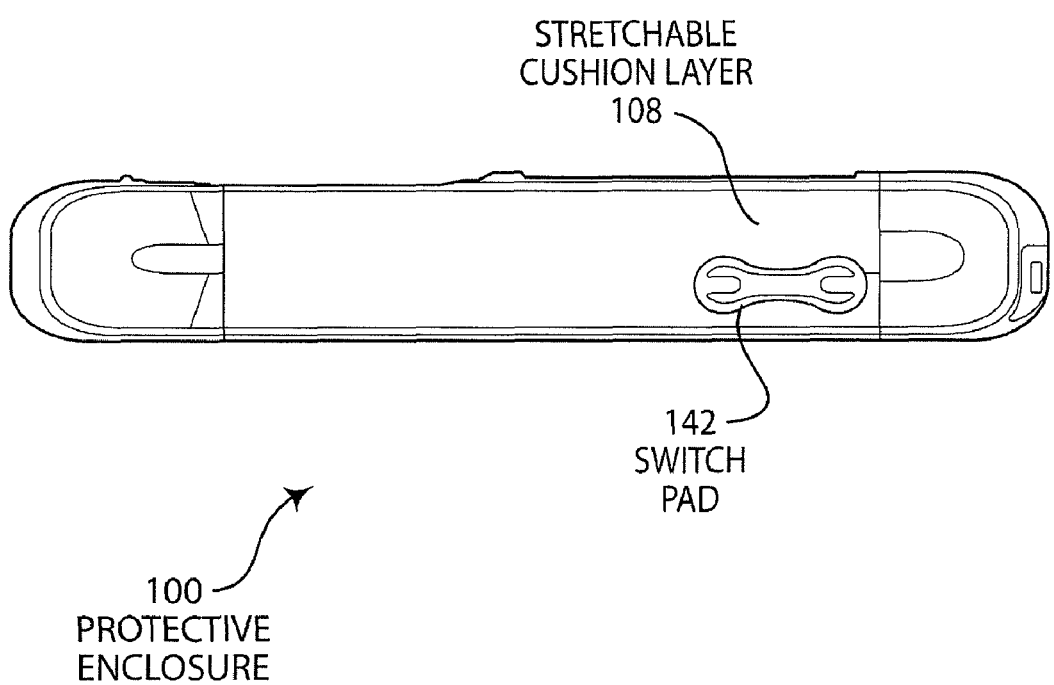
FIG. 9 is a left side view of the embodiment of the protective enclosure illustrated in FIG. 5.

FIG. 9 is a right side view of the protective enclosure 100 showing switch pad 142 in the stretchable cushion layer 108 that aligned with opening 128 in the back shell 106 (FIG. 1). The switch pad 142 allows the user to access the push button/tilt switch 118.

Figure 10:
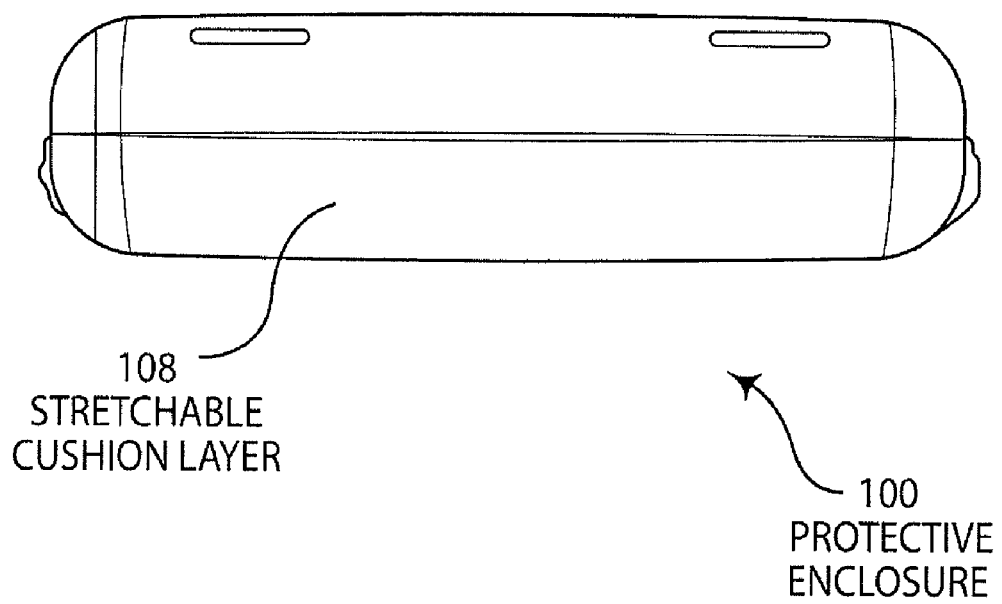
FIG. 10 is a bottom view of the embodiment of the protective enclosure illustrated in FIG. 5.

FIG. 10 is a bottom view of the protective enclosure 100 illustrating the unitary nature of the stretchable cushion layer 108. The stretchable cushion layer 108 has built in padding, especially around the corners of the electronic device 110 to provide cushioning to protect the electronic device 110 in a dropped situation.

Figure 11:
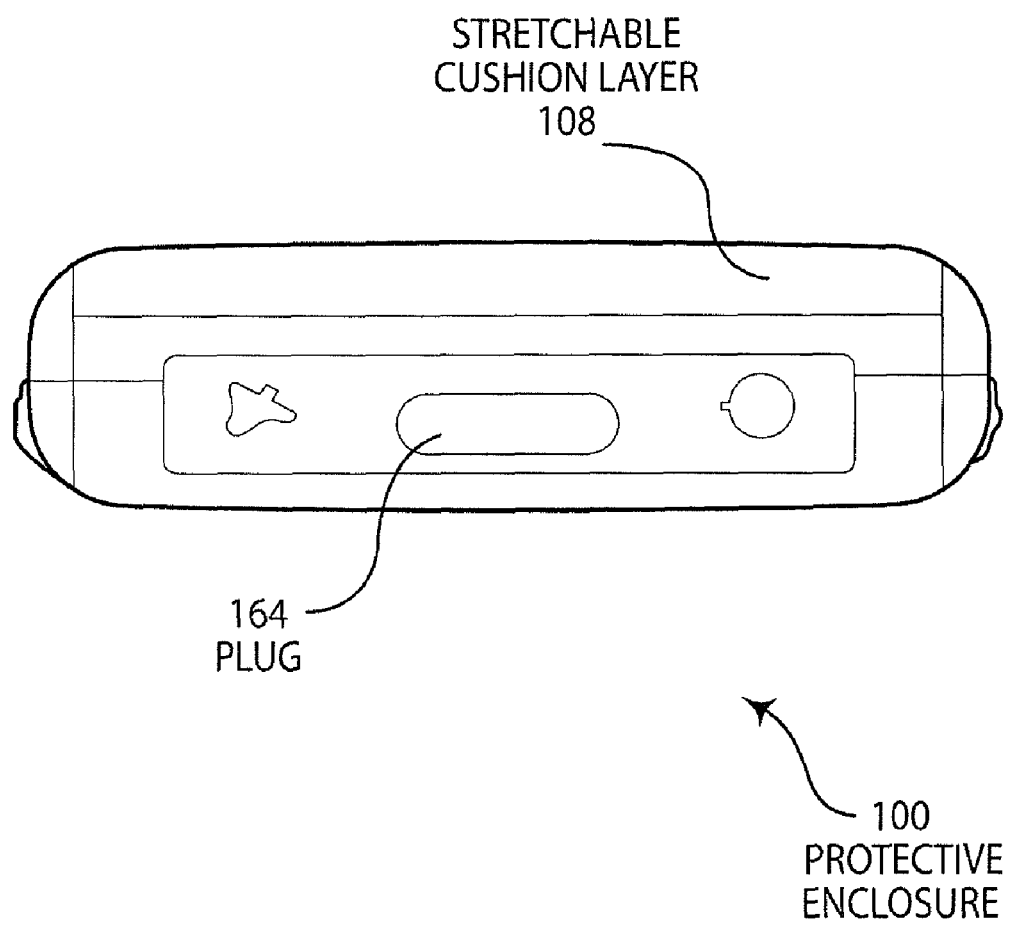
FIG. 11 is a top view of the embodiment of the protective enclosure illustrated in FIG. 5.

FIG. 11 is a top view of the protective enclosure 100. As shown in FIG. 11, a plug 164 is formed in the stretchable cushion layer 108. The plug 164 is a plug that can be opened, which provides a water-resistant seal and allows access to an electronic port in the electronic device 110.

Figure 12:
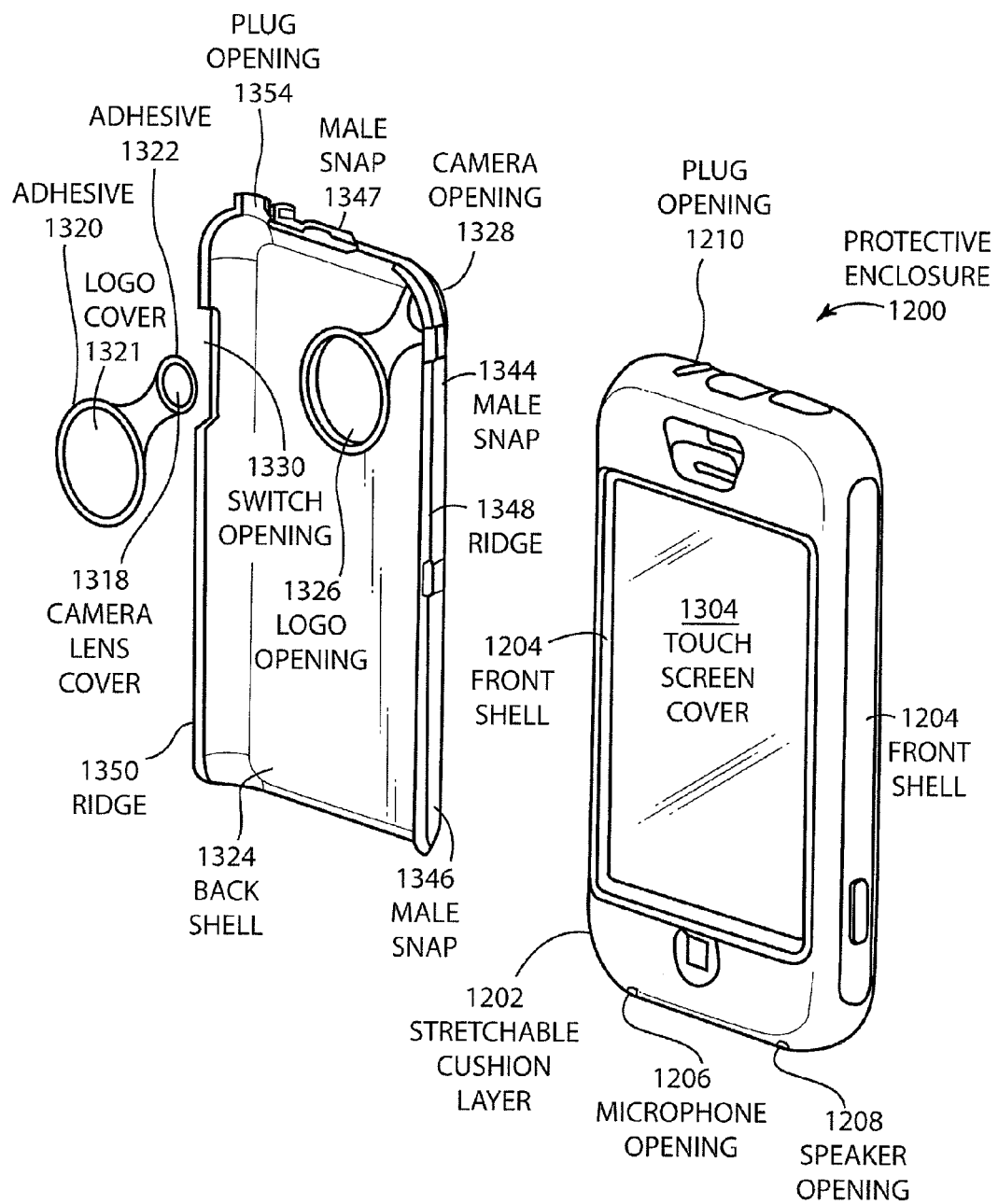
FIG. 12 is an isometric view of another embodiment of a protective enclosure.
Figure 13:
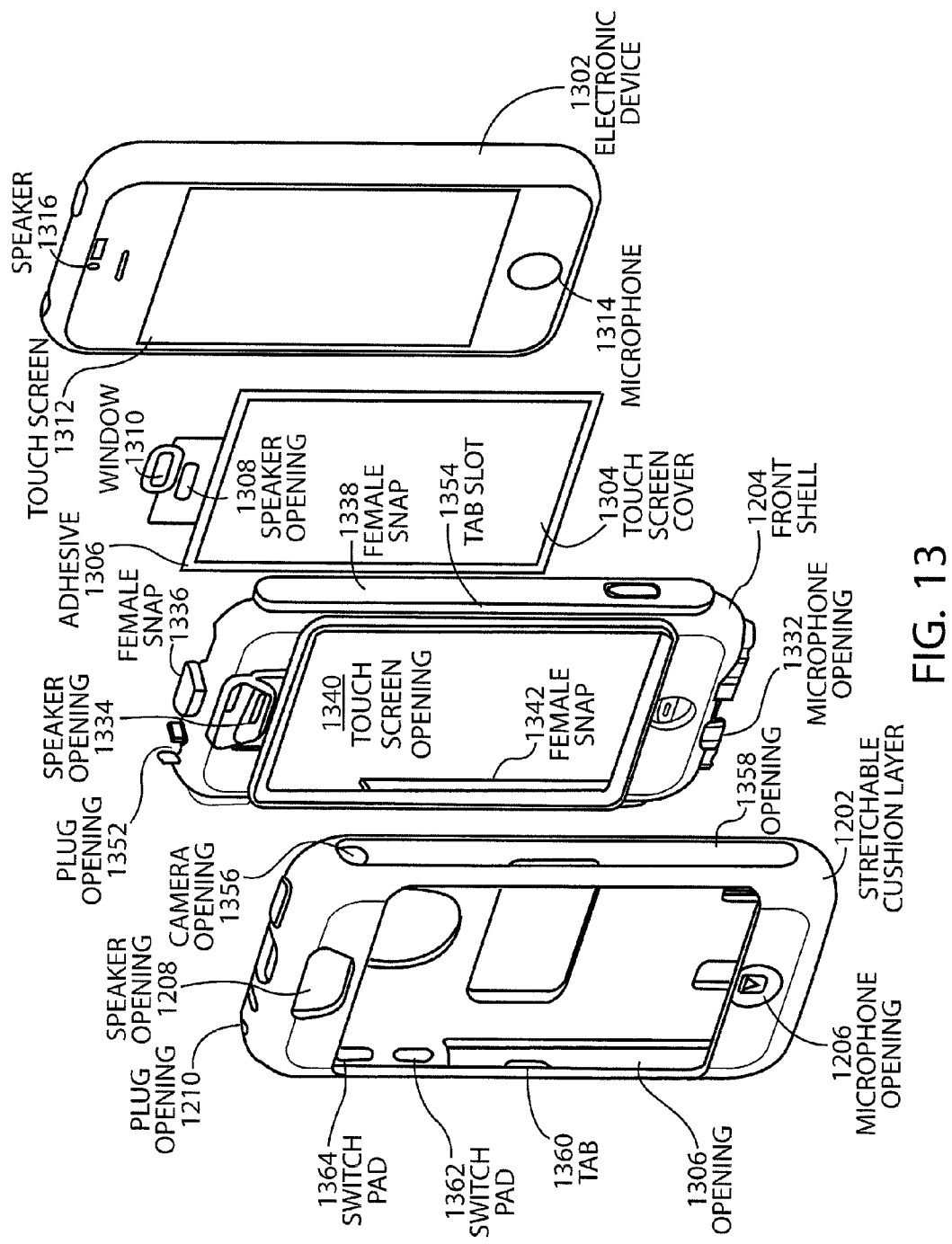
FIG. 13 is an exploded assembly diagram of the protective enclosure illustrated in FIG. 12.

FIG. 12 is an isometric view of another embodiment of a protective enclosure 1200. As shown in FIG. 12, the protective enclosure 1200 has a stretchable cushion layer 1202 that can be made of a thermoplastic rubber or silicon material, neoprene or other cushioning material that is capable of stretching over and forming to the assembled front shell 1204 and back shell 1324 (FIG. 13). The modulus of elasticity of the stretchable cushion layer 1202 is sufficient to allow the stretchable cushion layer 1202 to conform tightly to the shells. The stretchable cushion layer 1202 enhances the grip of the protective enclosure 1200 and is made of a soft cushioning material that cushions the electronic device 1302 (FIG. 13) if the protective enclosure 1200 is dropped on a hard surface. The stretchable cushion layer 1202 has sufficient elasticity to hold the assembled front shell 1204 and back shell 1324 (FIG. 13) together and be form fit to the assembled shells. The stretchable cushion layer 1202, in addition, provides a decorative layer and can be made of different colors and provide a contrast of colors with the portions of the front shell 1204 and back shell 1324 (FIG. 13) that show through the stretchable cushion layer 1202. The stretchable cushion layer 1202 has a microphone opening 1206 that allows transmission of acoustical waves through the stretchable cushion layer 1202 to a microphone 1314 (FIG. 13) that is disposed in the electronic device 1302 (FIG. 13). Similarly, the stretchable cushion layer 1202 includes a speaker opening 1208 for transmission of acoustical waves through the stretchable cushion layer 1202 from a speaker 1316 (FIG. 13) of the electronic device 1302 (FIG. 13). The stretchable cushion layer 1202 also includes a plug opening 1210 that allows for various types of plugs to be inserted into ports in the electronic device 1302 (FIG. 13), such as earplugs, etc. The protective enclosure 1200 also includes a touch screen cover 1304 (FIG. 13) that can be made of a thin, hard plastic material, such as polycarbonate or acrylic, a thin, rigid, or non-rigid clear or transparent material, or a thin glass layer, such as thin tempered glass, or other thin, hard materials that are transparent, so that the touch screen 1312 (FIG. 13) of the electronic device 1302 (FIG. 13) can be operated through the touch screen cover 1304 (FIG. 13). Various other openings may be formed in the stretchable cushion layer 1202 for various purposes. The protective enclosure 1200, illustrated in FIG. 12, does not utilize a membrane, but rather, is designed to operate with electronic devices that simply have a touch screen and do not include a keyboard. In the embodiment of FIG. 12, switch openings 1330 allow interactive access to switches through the stretchable cushion layer 1202. Similar openings can be provided on the front shell 1204. Hence, the primary method of interacting with the electronic device is through the touch screen cover 1304, which, as disclosed above, can comprise a thin, hard plastic that is somewhat flexible or a thin glass layer. Various openings, such as microphone opening 1206, speaker opening 1208, etc. can be covered by an acoustical screen, such as a Gortex layer, that resists water, but allows sound waves to pass through the acoustical screen. Other similar water-resistant materials can be used. In addition, a sealing material may be coated on the inside of the stretchable cushion layer 1202 and/or on the outside of the front shell 1204 and back shell 1324 to seal the stretchable cushion layer 1202 to the front shell 1204 and back shell 1324. Such a sealing material may permanently seal the stretchable cushion layer or may allow easy removal of the stretchable cushion layer and provide additional water resistance for the protective enclosure 1200. Alternatively, the stretchable cushion layer 1202 can be made of a material or coated with a material that has high affinity to the material of the front shell 1204 and the back shell 1324 to assist in sealing the stretchable cushion layer 1202 to front shell 1204 and back shell 1324.

FIG. 13 is an exploded assembly diagram of the protective enclosure 1200 (FIG. 12) and the electronic device 1302. As shown in FIG. 13, the electronic device 1302 fits snugly between the assembled front shell 1204 (FIG. 12) and back shell 1324. The front shell 1204 (FIG. 12) and back shell 1324 latch together with a snap fit using precisely manufactured male and female snaps, such as female snaps 1338, 1342, 1336 on the front shell 1204 (FIG. 12) that engage male snaps, such as male snaps 1344, 1346, 1347 on back shell 1324. In addition, ridges 1348, 1350 in the back shell 1324 fit tightly within a groove (not shown) in the front shell 1204 to create a tight snap fit between the front shell 1204 (FIG. 12) and back shell 1324.

Front shell 1204 (FIG. 12), as illustrated in FIG. 13, also includes a microphone opening 1332, to allow transmission of acoustical waves to the microphone 1314 of the electronic device 1302. An acoustical screen may be attached to the interior surface of the front shell 1204 (FIG. 12) around the microphone opening 1332 to prevent the passage of water into the interior portion of the assembled front shell 1204 (FIG. 12) and back shell 1324, while still allowing the passage of acoustical sound waves. In fact, acoustical screens may or may not be employed on each of the openings in the assembled front shell 1204 (FIG. 12) and back shell 1324 to provide different levels of protection against moisture and different pricing of the protective enclosure. Such an acoustical screen may be secured around the interior surface surrounding the speaker opening 1334 to allow acoustical waves to be transmitted from the speaker 1316 of the electronic device 1302 and substantially preventing water from entering speaker opening 1334. Plug opening 1352 in the front cover 1204 (FIG. 12) matches plug opening 1354 in the back shell 1324 and is aligned with the plug opening 1210 (FIG. 12) in the stretchable cushion layer 1202, as illustrated in FIG. 12.

As also shown in FIG. 13, the stretchable cushion layer 1202 (FIG. 12) is illustrated, which shows the microphone opening 1206 (FIG. 12) and the speaker opening 1208 (FIG. 12). As also shown in FIG. 13, the side portions of the stretchable cushion layer 1202 (FIG. 12) include openings 1356, 1358. The upper edge of the stretchable cushion layer 1202 (FIG. 12) that surrounds openings 1306, 1358 include tabs, such as tab 1360, that are inserted in tab slots, such as tab slot 1354 on the front shell 1204 (FIG. 12). The purpose of the tabs, such as tab 1360 and the tab slots, such as tab slot 1354, is to hold the stretchable cushion layer 1202 (FIG. 12) in position and tightly around the front portion of the front shell 1204 (FIG. 12) to ensure that the stretchable cushion layer 1202 (FIG. 12) fits tightly against and engages the front shell 1204 around the entire periphery of the front shell 1204 (FIG. 12). The stretchable cushion layer 1202 (FIG. 12) also includes switch pads 1362, 1364 that comprise raised portions of the stretchable cushion layer 1202 (FIG. 12) that engage switches (not shown) on the side of the electronic device 1302. These raised portions allow an operator to operate the switches on the side of the electronic device 1302 through the stretchable cushion layer 1202 (FIG. 12). In that regard, switch opening 1330 in the back shell 1324 and the front shell 1204 (FIG. 12) allow access of the switch pads 1362, 1364 to the switches (not shown) on the electronic device 1302. Plug opening 1210 (FIG. 12) includes a flap that allows the stretchable cushion layer 1202 (FIG. 12) to at least partially seal the plug opening 1352, 1354 that is formed in the front shell 1204 (FIG. 12), and back shell 1324, respectively, when a plug is not inserted into a port in the electronic device 1302. The stretchable cushion layer 1202 (FIG. 12) also includes a camera opening 1356 that is aligned with camera opening 1328 of the back shell 1324, so that the camera (not shown) of the electronic device 1302 has an optical passage through the protective enclosure 1200 (FIG. 12). Other openings on the back of the stretchable cushion layer 1202 (FIG. 12) allow portions of the back shell 1324 to show through the stretchable cushion layer 1202 (FIG. 12), so that logos and other information appear through the protective enclosure 1200 (FIG. 12).

The protective enclosure 1200 (FIG. 12) also includes a touch screen cover 1304. Touch screen cover 1304 may include an adhesive 1306 around the periphery of the touch screen cover 1304 to attach the touch screen cover 1304 to the inside surface of the front shell 1204 (FIG. 12). Various types of adhesives can be used to permanently or removably attach the touch screen cover 1304 to the inside surface of the front shell 1204 (FIG. 12). Alternatively, the touch screen cover may be attached around an interior rim in the touch screen opening 1340 of the front shell 1204 (FIG. 12). All of these attachments may be made using an adhesive, or the cover 1304 may be welded to the front shell 1204 using thermal welding, sonic welding, etc. The touch screen cover 1304 may also be attached to the front surface of the front shell 1204 (FIG. 12). Alternatively, the touch screen cover 1304 may constitute a portion of the front shell 1204 (FIG. 12). In other words, the front shell 1204 (FIG. 12) may be formed so that it includes a touch screen cover that comprises a thinner portion of the front shell 1204 (FIG. 12) that is transparent. Further, the touch screen cover 1304 may include a speaker opening 1308 to allow acoustical waves to be transmitted through the touch screen cover 1304. An acoustical vent may be placed around speaker opening 1308 to prevent passage of water. Window 1310 in touch screen cover 1304 comprises a window for the transmission of light, through the touch screen cover, to sensors on the enclosed device. The window 1310 has an adhesive layer surrounding the window 1310 to secure the window 1310 to the back shell 1324.

Since the protective enclosure 1200, illustrated in FIG. 12, is to be used in conjunction with a touch screen device, the type of touch screen cover 1304 that is used on the protective enclosure 1200 will depend on the type of touch screen 1312 that is used by the electronic device 1302. Essentially, there are three basic types of touch screens that are currently used, i.e., the resistive, capacitive and surface acoustic wave types of touch screens. Resistive touch screens have a glass panel that is covered with a conductive and a resistive metallic layer. These two layers are held apart by spacers. An electric current is separately applied to the two layers. When a user touches the screen, the two layers make contact at the spot where the user touches the screen. A change in the electric field is detected and the coordinates of the point of contact are then calculated by a processor in the electronic device. Once the coordinates are known, the information is used by the electronic device.

In a capacitive type of touch screen, a layer that stores electrical charge is placed on a glass panel that forms part of the touch screen system. When a user touches the touch screen with a finger, the charge is transferred to the user, so that the charge on the layer that stores the electrical charge decreases. This decrease in the electrical charge is measured by circuits located at each corner of the touch screen. The relative differences in the charge at each corner are measured and these measurements are used by a processor to calculate exactly where the touch event took place on the touch screen. The calculated location is then used by the electronic device to process the information.

Surface acoustic wave touch screens operate using two transducers. One transducer is used to receive surface acoustic waves and the other one is used to send surface acoustic waves. These transducers are placed along the X and Y axis of the glass plate of the touch screen. Reflectors are also placed on the glass plate of the touch screen that reflect an electrical signal sent from one transducer to the other. The receiving transducer is able to tell if the wave has been disturbed by a touch event at any instant and can locate the touch event accordingly. Surface acoustic wave touch screens have no metallic layers on the screen, which allows 100 percent of the light to penetrate the touch screen system.

Another type of touch screen system is a multi-touch screen system that is used in the iPhone. The multi-touch system includes a layer of capacitive material, but the capacitors are arranged in a coordinate system. Circuitry is used to sense changes at each point along the grid of the capacitors, so that every point on the grid generates its own signal when touched, which is sent to a processor in the electronic device 1302. This allows the touch screen to determine the location and movement of simultaneous touches in multiple locations. Because of the reliance of this type of system on capacitive material, the iPhone works only if it is touched with a fingertip and will not work with a stylus, or if the user wears non-conductive gloves. Further, these types of systems can either use mutual capacitance or self-capacitance. In mutual capacitance systems, the capacitive circuitry requires two distinct layers of material. One layer of material houses drive lines, which carry current, and the other layer of material houses sensing lines, which detect the current at nodes. In self capacitance systems, there is only one layer of individual electrodes connected with capacitance sensing circuitry.

Hence, selection of the touch screen cover 1304 requires that the material that is used for the touch screen cover 1304 be amenable to the type of touch screen 1302 used by the electronic device 1304. For example, for iPhones, a material suitable for transmitting capacitive inputs must be used, as more fully disclosed in U.S. Pat. Nos. 6,646,846, 6,995,976, 7,158,376 and 7,180,735, and U.S. patent application Ser. Nos. 11/270,732, 11/420,683, 11/456,157, 11/466,342 and 11/676,986, which are specifically incorporated herein by reference for all that they disclose and teach. Suitable materials include Lexan or other types of polycarbonates that are on the order of 0.010 inches thick, to transmit the capacitive input. Alternatively, PVC or silicon may be used with a cross-sectional thickness that is sufficiently thin to allow interactability. For example, thin layers of glass can be used that are capable of transmitting the capacitive input. Although thicknesses on the order of 0.010 inches may be preferable, thicknesses ranging from 0.005-0.035 inches will still allow operation of a capacitive type of touch screen. Of course, any type of thin material, such as glass, polycarbonate, Lexan, PVC, or other thin plastic material, as indicated above, can be used, as long as the layer is sufficiently thin to allow transmission of the capacitive input and the plastic material is a material that is non-conductive and will allow transmission of the capacitive input.

If a resistive type of touch screen is used, the touch screen cover 1304 may be flexible to allow deflection of the touch screen cover 1304 to flex against the resistive touch screen 1312 of the electronic device 1302, so that the layers of the resistive touch screen are deflected and touch each other.

In the embodiment illustrated in FIG. 13, the touch screen cover 1304 is adhered to the inner surface of the front shell 1204 (FIG. 12), so that the touch screen cover 1304 is adjacent to the touch screen 1312, when the electronic device 1302 is disposed in the protective enclosure 1200 (FIG. 12) and is adjacent the touch screen 1312 to allow proper activation of touch screen 1312. By disposing the touch screen cover 1304 on the inside surface of the front shell 1204 (FIG. 12), the touch screen cover 1304 is recessed from the first surface of the front shell 1204 (FIG. 12). Further, the touch screen cover 1304 is protected by the front shell 1204 (FIG. 12) that extends above the recessed touch screen 1304 and prevents damage to the touch screen cover 1304 and touch screen 1312. The recess also prevents scratching of the touch screen 1304 and other types of damage.

As also shown in FIG. 13, the adhesive 1320, on the logo cover 1321, and adhesive 1322 on the camera lens cover 1318, is used to seal the camera lens cover 1318 and logo cover 1321 to the back shell 1324. In this manner, the logo opening 1326, as well as the camera opening 1328, are sealed on the back shell 1324 from water, dirt and dust.

Of course, the electronic device, such as electronic device 110 (FIG. 1), electronic device 1302 (FIG. 13), and electronic device 1402 (FIG. 14) can be any type of electronic device that requires interactivity with a user of the device, including various types of MP3 players, cell phones, satellite phones, telematics devices, pagers, walkie talkies, GPS navigational devices, bar code readers, as well as various types of computers, including portable computers, laptop computers, handheld computers, ultra-mobile computers, tablet computers, and various hybrid devices that combine two or more of these functions. In addition, these devices may operate with only a touch screen interface or only with a keyboard or other type of manual input and are not limited to devices that include keyboards or buttons in combination with a touch screen.

Figure 14:
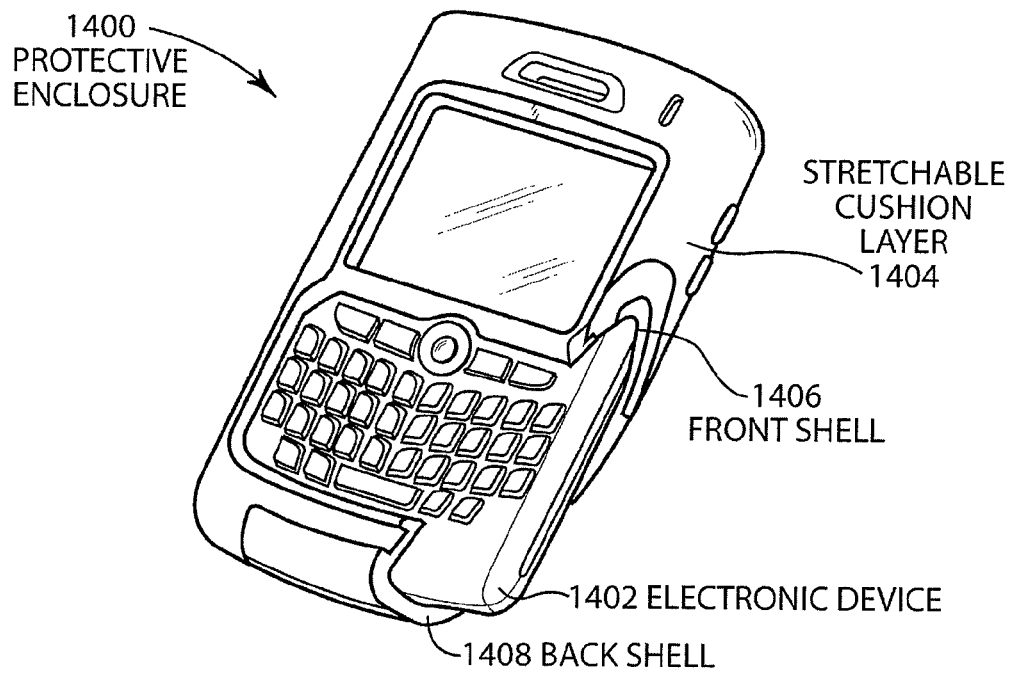
FIG. 14 is an isometric view of another embodiment of a protective enclosure.

FIG. 14 is an isometric cutaway view of another embodiment of a protective enclosure 1400. As shown in FIG. 14, the protective enclosure 1400 protects an electronic device 1402. The protective enclosure 1400 includes a stretchable cushion layer 1404 that surrounds an assembled front shell 1406 and back shell 1408.

Figure 15:
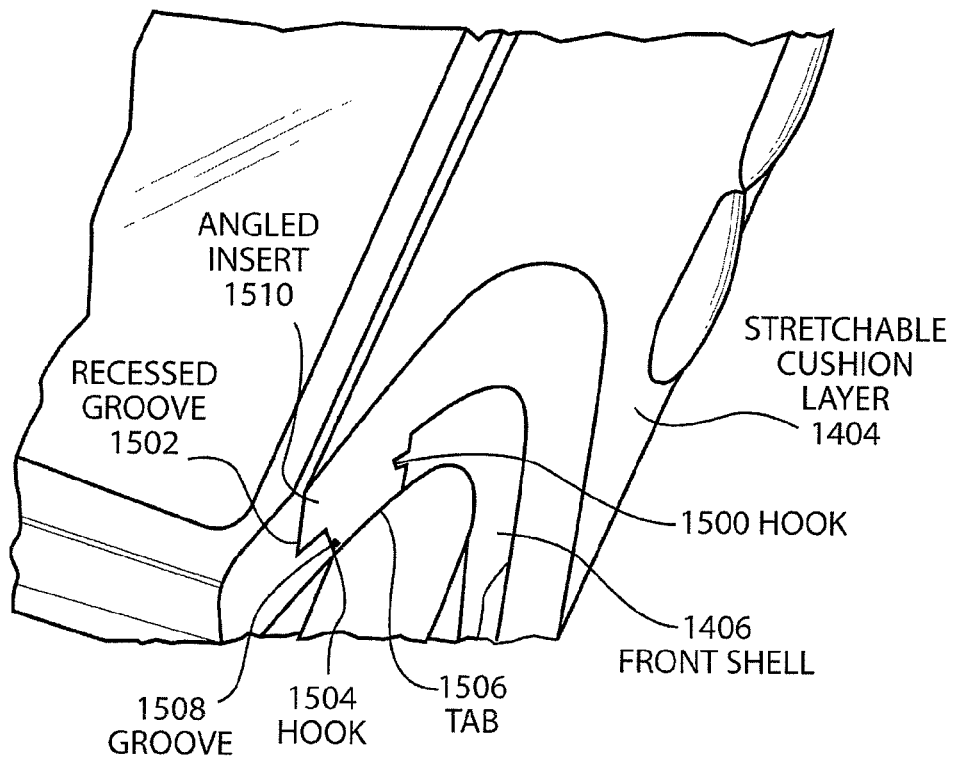
FIG. 15 is an exploded close-up view of the cutaway portion of the protective enclosure illustrated in FIG. 14.

FIG. 15 is an exploded close-up view of the cutaway portion of the protective enclosure 1400 that is illustrated in FIG. 14. As shown in FIG. 15, the stretchable cushion layer 1404 (FIG. 14) has a tab 1506 that is inserted in a groove 1508. The groove 1508 includes hooks 1500, 1504 that assist in holding the tab 1506 in place in the groove 1508. Further, the stretchable cushion layer 1404 (FIG. 14) includes an angled insert 1510 that is inserted in a recessed groove 1502. The length and depth of the recessed groove 1502 and angled insert 1510 help to hold the stretchable cushion layer in position along the edge of the display screen. Although the stretchable cushion layer 1404 is shown as having a tab 1506, and the front shell 1406 is shown as having a groove 1508, the opposite type of structure could also be used. For example, the front shell 1406 could include a tab, while the stretchable cushion layer 1404 could include a groove that interfaces with the tab to hold the stretchable cushion layer 1404 to the front shell 1406. Further, plugs, such as plug 164 that is illustrated in FIG. 11, that are formed in the stretchable cushion layer 108, illustrated in FIG. 11, could also contain grooves that interface with a lip or hook, such as hook 1500, illustrated in FIG. 15, to hold the plug 164 in place. As indicated above, this structure can also be reversed.

Figure 16:
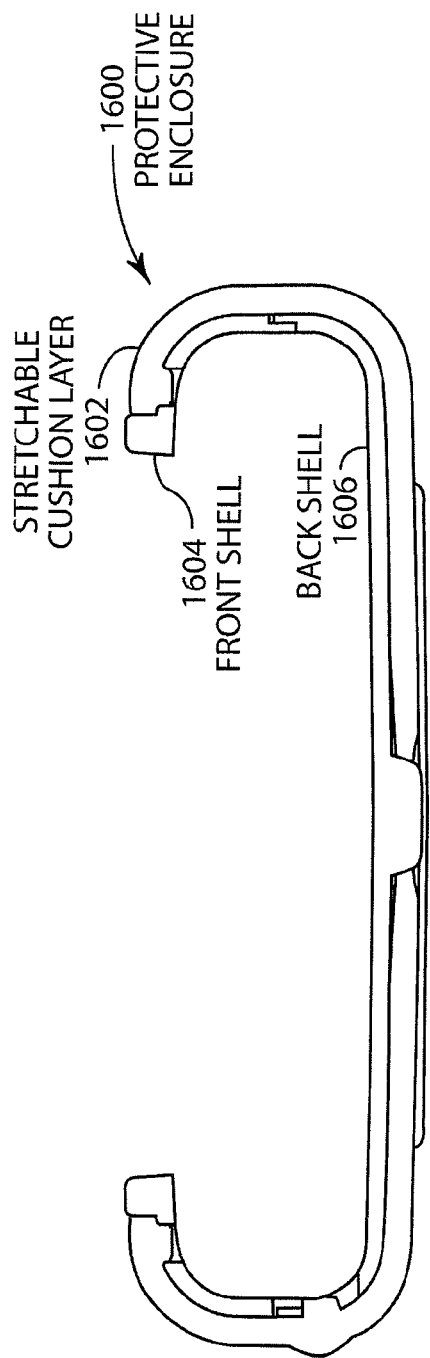
FIG. 16 is a side cutaway view of another embodiment of a protective enclosure.

FIG. 16 is a side cutaway view of a protective enclosure 1600. As shown in FIG. 16, the protective enclosure includes a front shell 1604 that is assembled to a back shell 1606. A stretchable cushion layer 1602 is mounted over and conformed to the assembled front shell 1604 and back shell 1606.

Figure 17:
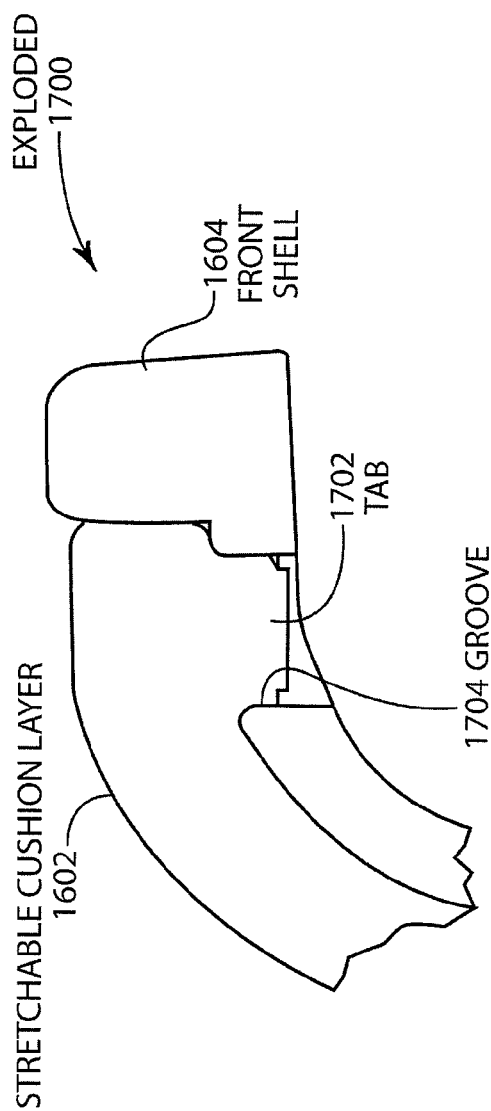
FIG. 17 is a close-up view of a portion of the protective enclosure illustrated in FIG. 16.

FIG. 17 is a close-up view of a portion of the protective enclosure 1600 illustrated in FIG. 16. As shown in FIG. 17, the stretchable cushion layer 1602 (FIG. 16) has a tab 1702 that is inserted in a groove 1704. Tab 1702 helps to hold the edge of the stretchable cushion layer 1602 (FIG. 16) against the front shell 1604 (FIG. 16) in a tight configuration so that the stretchable cushion layer 1602 (FIG. 16) fits tightly against the front shell 1604 (FIG. 16). The tab 1702 fits tightly in the groove 1704 to hold the stretchable cushion layer 1602 (FIG. 16) in place.

Figure 18:
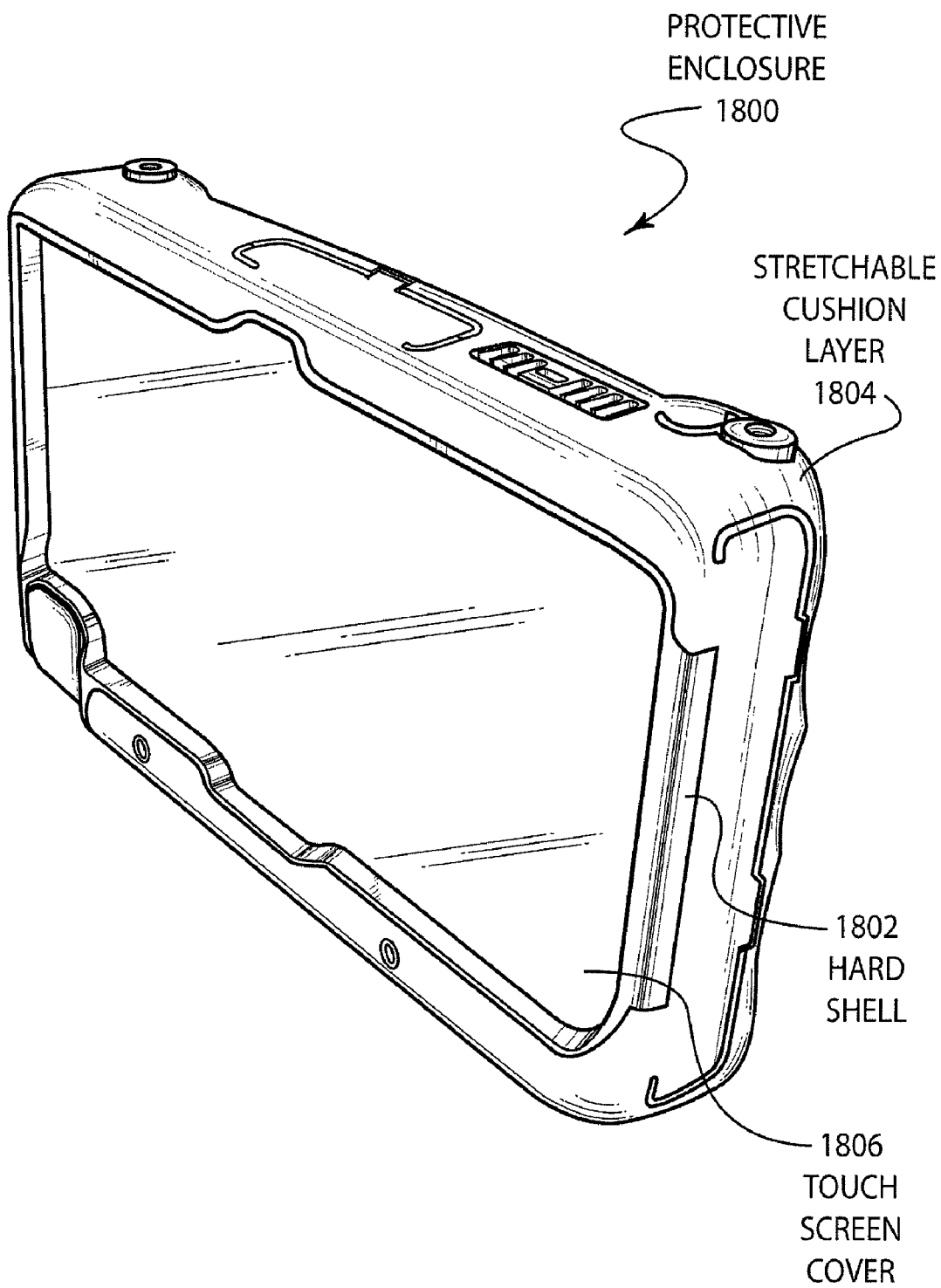
FIG. 18 is an isometric view of another embodiment of a protective enclosure for a computer.

FIG. 18 is an isometric view of a protective enclosure 1800 for a computer. As shown in FIG. 18, the protective enclosure 1800 includes a hard shell 1802 that is surrounded by a stretchable cushion layer 1804. The hard shell provides protection for the computer from impacts, while the stretchable cushion layer 1804 provides cushioning and shock protection, in the same manner as described above, with regard to the various other embodiments. A touch screen cover 1806 can be permanently or removeably mounted on the hard shell 1802. The touch screen cover 1806 provides scratch protection to the computer touch screen and is disposed adjacent to the computer touch screen to allow interactive use of the touch screen. As indicated above, various suitable materials can be used for the type of touch screen employed in the computer. Although the embodiment of FIG. 18 depicts a protective enclosure 1800 for a computer that has an interactive touch screen, a form fitted membrane can also be used in conjunction with the touch screen cover 1806 to allow access to a keyboard on a computer. As disclosed above, the protective enclosure 1800 can also be used without such a membrane. Of course, all of the features mentioned above, with respect to the various other types of protective enclosures, can be utilized in the protective enclosure 1800 for a computer device.

The foregoing description of the invention has been presented for purposes of illustration and description. It is not intended to be exhaustive or to limit the invention to the precise form disclosed, and other modifications and variations may be possible in light of the above teachings. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

The invention claimed is:

1. A protective enclosure for an electronic device, said protective enclosure comprising:
   a stretchable cushion layer that is disposed over a hard shell cover that fits over said electronic device, wherein said stretchable cushion layer has sufficient elasticity to substantially conform to said hard shell cover and provide cushioning to said protective enclosure, said stretchable cushion layer exposing at least a portion of said hard shell cover and having a tab disposed to fit into a corresponding groove in said hard shell cover.

2. The protective enclosure of claim 1, wherein said hard shell cover is formed to provide openings that allow a user to have interactive access to controls of said electronic device, said hard shell cover providing rigidity to said protective enclosure, said hard shell cover comprising a front shell formed to a rigid shape of a front portion of said electronic device and a back shell formed to a rigid shape of a rear portion of said electronic device.

3. The protective enclosure of claim 1, further comprising a flexible membrane that is molded to fit over at least a front portion of said electronic device and that allows interactive access to said controls on said front portion of said electronic device.

4. The protective enclosure of claim 1, further comprising a touch screen cover that is attached to said hard shell cover, said touch screen cover being sufficiently thin and disposed sufficiently close to a touch screen of said electronic device when said electronic device is disposed in said protective enclosure to allow activation of said touch screen through said touch screen cover.

5. A protective enclosure for an electronic device, said protective enclosure comprising:

a stretchable cushion layer that is disposed over a hard shell cover that fits over said electronic device, wherein said stretchable cushion layer has sufficient elasticity to substantially conform to said hard shell cover and provide cushioning to said protective enclosure, said stretchable cushion layer exposing at least a portion of said hard shell cover, said hard shell cover comprising a tab disposed to fit into a corresponding groove in said stretchable cushion layer.

6. The protective enclosure of claim 5, wherein said hard shell cover is formed to provide openings that allow a user to have interactive access to controls of said electronic device, said hard shell cover providing rigidity to said protective enclosure, said had shell cover comprising a front shell formed to a rigid shape of a front portion of said electronic device and a back shell formed to a rigid shape of a rear portion of said electronic device.

7. The protective enclosure of claim 5, further comprising a flexible membrane that is molded to fit over at least a front portion of said electronic device and that allows interactive access to said controls on said front portion of said electronic device.

8. The protective enclosure of claim 5, further comprising a touch screen cover that is attached to said hard shell cover, said touch screen cover being sufficiently thin and disposed sufficiently close to a touch screen of said electronic device when said electronic device is disposed in said protective enclosure to allow activation of said touch screen through said touch screen cover.

* * * * *

UNITED STATES PATENT AND TRADEMARK OFFICE
CERTIFICATE OF CORRECTION

PATENT NO.         : 8,395,894 B2                         Page 1 of 1
APPLICATION NO.    : 13/043205
DATED              : March 12, 2013
INVENTOR(S)        : Curtis R. Richardson et al.

It is certified that error appears in the above-identified patent and that said Letters Patent is hereby corrected as shown below:

On the Title page, item (60) of the Related U.S. Application Data section should additionally include, after "Provisional application No. 60/942,429, filed on Jun. 6, 2007":

--and provisional application No. 61/029432, filed on Feb. 18, 2008--.

Signed and Sealed this
Thirty-first Day of March, 2015

Michelle K. Lee
*Director of the United States Patent and Trademark Office*